US009246075B2

(12) United States Patent
Sakai et al.

(10) Patent No.: US 9,246,075 B2
(45) Date of Patent: Jan. 26, 2016

(54) TUBULAR THERMOELECTRIC GENERATION DEVICE

(71) Applicant: Panasonic Intellectual Property Management Co., Ltd., Osaka (JP)

(72) Inventors: Akihiro Sakai, Nara (JP); Tsutomu Kanno, Kyoto (JP); Kohei Takahashi, Osaka (JP); Hiromasa Tamaki, Osaka (JP); Hideo Kusada, Osaka (JP); Yuka Yamada, Nara (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/659,183

(22) Filed: Mar. 16, 2015

(65) Prior Publication Data

US 2015/0280098 A1    Oct. 1, 2015

(30) Foreign Application Priority Data

Mar. 27, 2014  (JP) ................................. 2014-066941

(51) Int. Cl.
*H01L 35/04* (2006.01)
*H01L 35/34* (2006.01)
*H01L 35/32* (2006.01)

(52) U.S. Cl.
CPC ................ *H01L 35/32* (2013.01); *H01L 35/34* (2013.01)

(58) Field of Classification Search
CPC ................................. H01L 35/04; H01L 35/34
USPC ......................................... 136/201, 203, 205
See application file for complete search history.

(56) References Cited

U.S. PATENT DOCUMENTS 3,272,659 A * 9/1966 Bassett, Jr. ............... H01L 35/00
                                                       136/203
3,601,887 A * 8/1971 Mitchell .................. H01L 35/34
                                                       136/201

(Continued)

FOREIGN PATENT DOCUMENTS

JP        7-106641         4/1995
JP        2006-294738      10/2006

(Continued)

OTHER PUBLICATIONS

G. Min et al., "Ring-structured thermoelectric module", Semiconductor Science and Technology, 22, pp. 880-883 (2007).

(Continued)

*Primary Examiner* — Golam Mowla
(74) *Attorney, Agent, or Firm* — McDermott Will & Emery LLP

(57) ABSTRACT

The present invention provides a tubular thermoelectric generation device, comprising: a plurality of plate-like p-type thermoelectric members each having an external periphery, a through hole, and an internal periphery formed around the through hole; a plurality of plate-like n-type thermoelectric members each having an external periphery, a through hole, and an internal periphery formed around the through hole; a plurality of external electrodes; and a plurality of internal electrodes. Each of the plurality of the external electrodes comprises an internal flange expanded in a direction from the external periphery of the p-type thermoelectric member toward the internal periphery of the p-type thermoelectric member. Each of the plurality of the internal electrodes comprises an external flange expanded in a direction from the internal periphery of the p-type thermoelectric member toward the external periphery of the p-type thermoelectric member.

25 Claims, 18 Drawing Sheets

(56) References Cited

U.S. PATENT DOCUMENTS

| | | | | | |
|---|---|---|---|---|---|
| 3,781,176 | A | * | 12/1973 | Penn | F25B 21/02 136/201 |
| 3,859,143 | A | * | 1/1975 | Krebs | H01L 35/16 136/205 |
| 3,879,229 | A | * | 4/1975 | Gilbert | H01L 35/34 136/202 |
| 3,881,962 | A | * | 5/1975 | Rubinstein | F23B 7/00 136/208 |
| 3,989,546 | A | * | 11/1976 | Purdy | H01L 35/00 136/202 |
| 4,043,835 | A | * | 8/1977 | Hall, Jr. | H01L 35/30 136/221 |
| 4,162,369 | A | * | 7/1979 | Brown | G21H 1/103 136/202 |
| 4,639,542 | A | * | 1/1987 | Bass | H01L 35/30 136/209 |
| 4,730,459 | A | * | 3/1988 | Schlicklin | H01L 35/08 136/203 |
| 5,228,923 | A | * | 7/1993 | Hed | H01L 35/32 136/203 |
| 5,430,322 | A | * | 7/1995 | Koyanagi | B64G 1/421 136/203 |
| 5,554,819 | A | * | 9/1996 | Baghai-Kermani | B64D 41/00 136/206 |
| 6,020,671 | A | * | 2/2000 | Pento | H02N 3/00 136/200 |
| 6,207,887 | B1 | * | 3/2001 | Bass | H01L 35/32 136/201 |
| 6,226,994 | B1 | * | 5/2001 | Yamada | F25B 21/02 136/203 |
| 6,236,810 | B1 | * | 5/2001 | Kadotani | F25B 21/02 392/483 |
| 2013/0152562 | A1 | | 6/2013 | An et al. | |
| 2013/0160807 | A1 | | 6/2013 | Brueck | |

FOREIGN PATENT DOCUMENTS

| | | |
|---|---|---|
| JP | 2013-016685 | 1/2013 |
| JP | 2013-125960 | 6/2013 |
| JP | 2013-539599 | 10/2013 |

OTHER PUBLICATIONS

A. Schmitz et al., "Preparation of Ring-Shaped Thermoelectric Legs from PbTe Powders for Tubular Thermoelectric Modules", Journal of Electronic Materials, vol. 42, pp. 1702-1706 (2013).

* cited by examiner

TUBULAR THERMOELECTRIC GENERATION DEVICE

BACKGROUND

1. Technical Field

The present invention relates to a tubular thermoelectric generation device. In particular, the present invention relates to a tubular thermoelectric generation device having high power generation efficiency.

2. Description of the Related Art

Japanese Patent laid-open Publication No. Hei 07-106641A discloses an integral ring type thermoelectric conversion element and device employing same. FIG. 14 shows the integral ring type thermoelectric conversion element disclosed therein. As shown in FIG. 14, this integral ring type thermoelectric conversion element comprises n-type semiconductor ring elements 2, p-type semiconductor ring elements 3, external copper rings 4, nylon external rings 5, internal copper rings 6, and nylon inside rings 7.

Integral ring type thermoelectric conversion elements are also disclosed in G. Min and D. Rowe, "Ring-structured thermoelectric module", Semiconductor Science and Technology, 22, pp. 880-883 (2007) and A. Schmitz et al., "Preparation of Ring-Shaped Thermoelectric Legs from PbTe Powders for Tubular Thermoelectric Modules", Journal of Electronic Materials, 42, pp. 1702-1706 (2013).

SUMMARY

The present invention provides a tubular thermoelectric generation device, comprising:

a plurality of plate-like p-type thermoelectric members each having an external periphery, a through hole, and an internal periphery formed around the through hole;

a plurality of plate-like n-type thermoelectric members each having an external periphery, a through hole, and an internal periphery formed around the through hole;

a plurality of external electrodes; and a plurality of internal electrodes, wherein the plurality of plate-like p-type thermoelectric members and the plurality of plate-like n-type thermoelectric members are disposed alternately along an axis direction of the tubular thermoelectric generation device so that each through hole of the plurality of plate-like p-type thermoelectric members and each through hole of the plurality of plate-like n-type thermoelectric members overlap each other;

each of the plurality of the external electrodes is in contact with the external peripheries of the p-type thermoelectric member and the n-type thermoelectric member which are adjacent to each other;

each of the plurality of the internal electrodes is in contact with the internal peripheries of the p-type thermoelectric member and the n-type thermoelectric member which are adjacent to each other;

the plurality of external electrodes and the plurality of internal electrodes are disposed alternately along the axis direction of the tubular thermoelectric generation device;

each of the plurality of the external electrodes comprises an internal flange expanded in a direction from the external periphery of the p-type thermoelectric member toward the internal periphery of the p-type thermoelectric member;

each of the internal flanges is interposed between the p-type thermoelectric member and the n-type thermoelectric member which are adjacent to each other;

each of the internal flanges is formed of an electrically conductive material;

a first insulation film is interposed between the internal flange and the p-type thermoelectric member;

a second insulation film is interposed between the internal flange and the n-type thermoelectric member;

each of the plurality of the internal electrodes comprises an external flange expanded in a direction from the internal periphery of the p-type thermoelectric member toward the external periphery of the p-type thermoelectric member;

each of the external flanges is interposed between the n-type thermoelectric member and the p-type thermoelectric member which are adjacent to each other;

each of the external flanges is formed of an electrically conductive material;

a third insulation film is interposed between the external flange and the p-type thermoelectric member; and a fourth insulation film is interposed between the external flange and the n-type thermoelectric member.

The present invention provides a tubular thermoelectric generation device having higher power generation efficiency.

DETAILED DESCRIPTION OF THE EMBODIMENTS

Hereinafter, the embodiments of the present invention will be described with reference to the drawings.

(First Embodiment)

Figure 1:
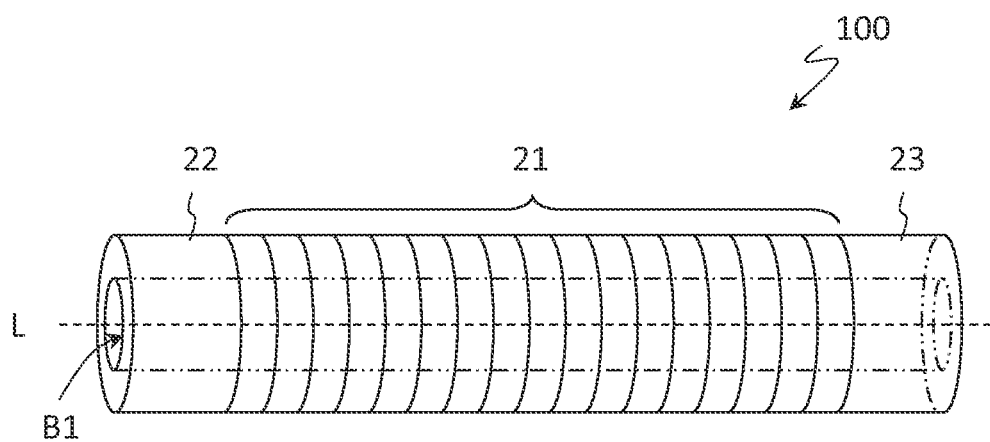
FIG. 1 shows a schematic view of a tubular thermoelectric conversion device according to a first embodiment.
Figure 1:
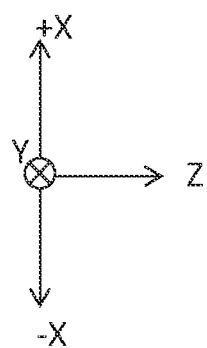

FIG. 1 shows a schematic view of a tubular thermoelectric conversion device 100 according to the first embodiment. The tubular thermoelectric conversion device 100 comprises a tubular thermoelectric generation device 21, a first terminal electrode 22, and a second terminal electrode 23, as shown in FIG. 1. The tubular thermoelectric generation device 21 is interposed between the first terminal electrode 22 and the second terminal electrode 23. The tubular thermoelectric conversion device 100 has an axis L, and has a through hole B1 along the axis L. Therefore, each of the tubular thermoelectric generation device 21, the first terminal electrode 22, and the second terminal electrode 23 has a through hole. These through holes are overlapped to form the through hole B1. As is described later, the through hole B1 is used as a flow path.

In the instant specification, +X direction, −X direction, Y direction and Z direction are defined as below. Z direction is parallel to the flow path formed of the through hole B1. In other words, Z direction is the direction in which a gas or a liquid flows in the flow path. Z direction is an axis direction of the tubular thermoelectric generation device 21, too. Each of +X direction, −X direction and Y direction is perpendicular to Z direction. +X direction and −X direction are perpendicular to Y direction. +X direction is the reverse direction of −X direction. A gas or a liquid flows along Z direction in the flow path formed of the through hole B1.

Figure 2:
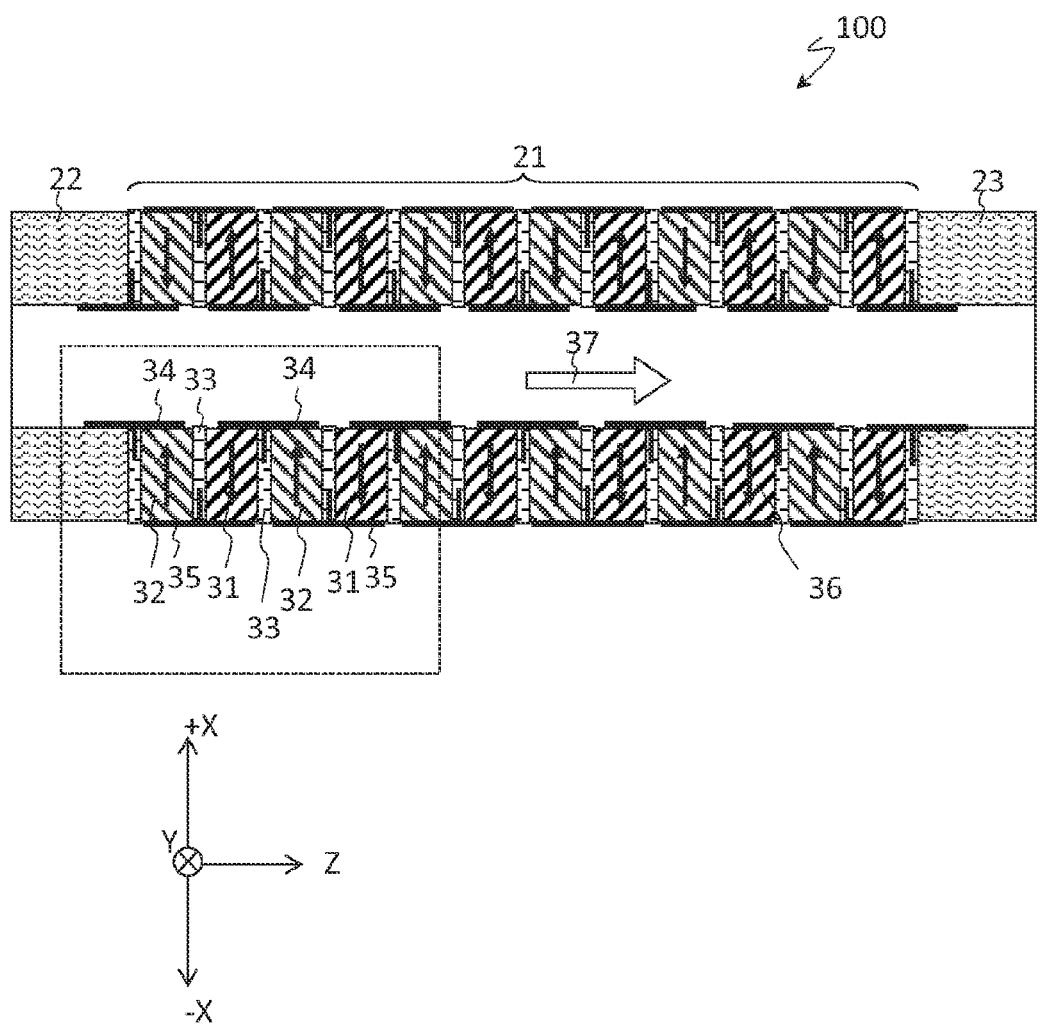
FIG. 2 shows a cross-sectional view of a tubular thermoelectric generation device.

FIG. 2 shows a cross-sectional view of the tubular thermoelectric generation device 21. The tubular thermoelectric generation device 21 comprises p-type thermoelectric members 31, n-type thermoelectric members 32, external electrodes 35, and internal electrodes 34, as shown in FIG. 2.

(p-type Thermoelectric Member 31)

Figure 3A:
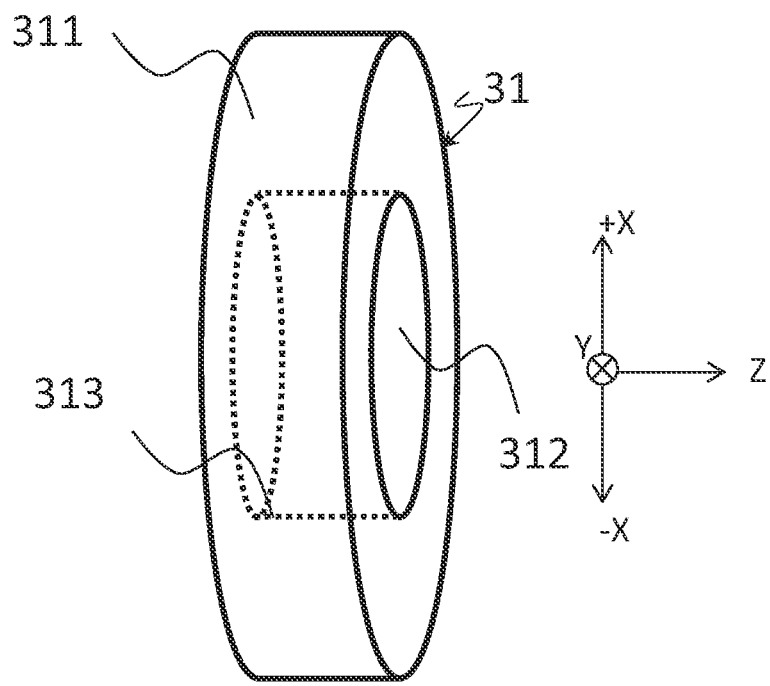
FIG. 3A shows a schematic view of a p-type thermoelectric member.
Figure 3B:
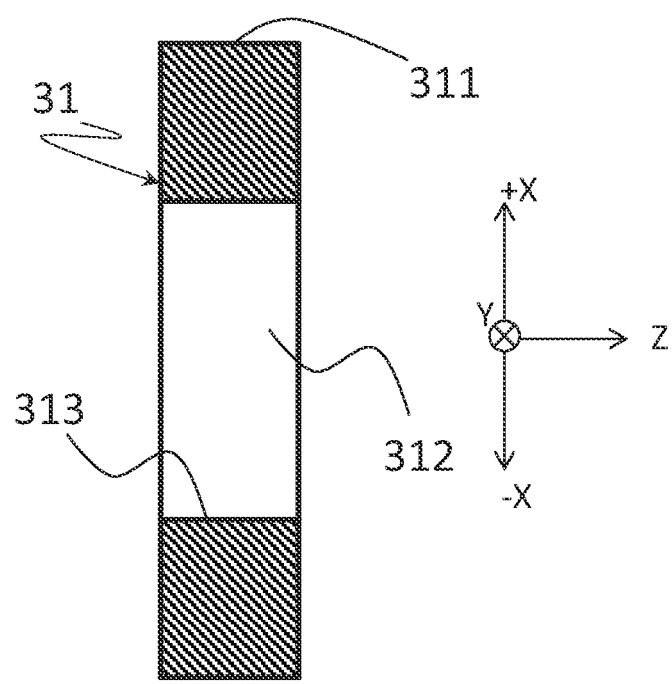
FIG. 3B shows a cross-sectional view of the p-type thermoelectric member 31.

FIG. 3A shows a schematic view of the p-type thermoelectric member 31. FIG. 3B shows a cross-sectional view of the p-type thermoelectric member 31. The p-type thermoelectric member 31 is plate-like and has an external periphery 311 and a through hole 312, as shown in FIG. 3A and FIG. 3B. In the instant specification, the through hole 312 included in the p-type thermoelectric member 31 is referred to as a p-type through hole in order to distinguish it from other through holes which will be described later. An internal periphery 313 is formed around the through hole 312.

An example of a material of the p-type thermoelectric member 31 is a semiconductor such as $Bi_2Te_3$, PbTe, or CoSi. $Bi_2Te_3$ is doped with Sb to be of p-type.

(n-type Thermoelectric Member 32)

Figure 4A:
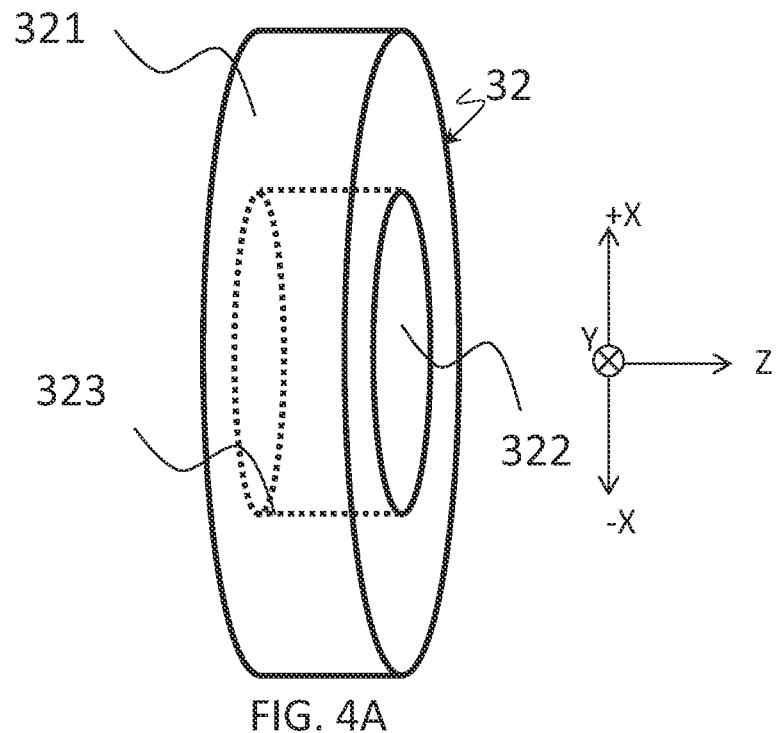
FIG. 4A shows a schematic view of an n-type thermoelectric member.
Figure 4B:
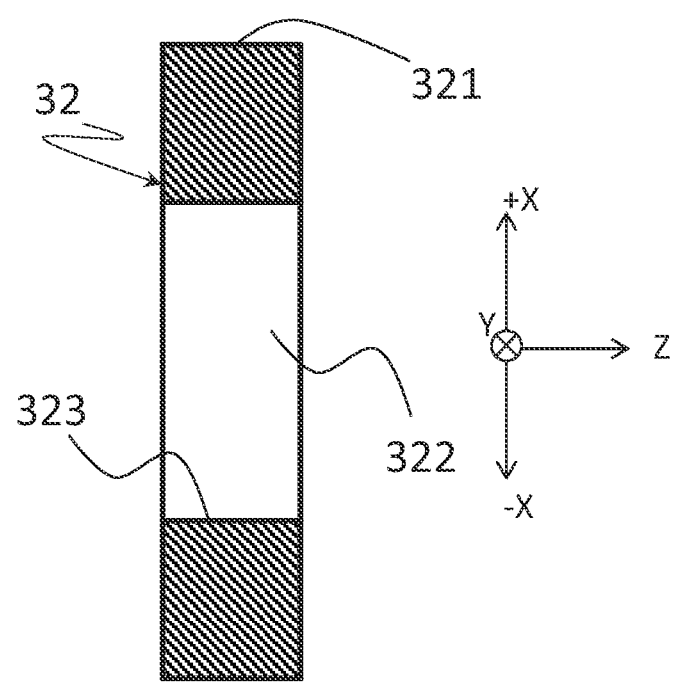
FIG. 4B shows a cross-sectional view of the n-type thermoelectric member 32.

FIG. 4A shows a schematic view of the n-type thermoelectric member 32. FIG. 4B shows a cross-sectional view of the n-type thermoelectric member 32. The n-type thermoelectric member 32 is plate-like and has an external periphery 321 and a through hole 322, as shown in FIG. 4A and FIG. 4B. In the instant specification, the through hole 322 included in the n-type thermoelectric member 32 is referred to as an n-type through hole in order to distinguish it from other through holes which will be described later. An internal periphery 323 is formed around the through hole 322.

An example of a material of the n-type thermoelectric member 32 is a semiconductor such as $Bi_2Te_3$, PbTe, or CoSi. $Bi_2Te_3$ is doped with Se to be of n-type.

As shown in FIG. 2, the p-type thermoelectric members 31 and the n-type thermoelectric members 32 are disposed alternately so that the p-type through holes 312 and the n-type through holes 322 overlap one another. In particular, the p-type through holes 312 and the n-type through holes 322 overlap one another along the normal direction of the plate-like p-type thermoelectric member 31 (namely, along Z direction). The through hole B1 is formed of the thus-overlapped through holes. In other words, as shown in FIG. 2, one p-type thermoelectric member 31 is interposed between two adjacent n-type thermoelectric members 32. One n-type thermoelectric member 32 is interposed between two adjacent p-type thermoelectric members 31. Needless to say, the p-type thermoelectric member 31 (or the n-type thermoelectric member 32) adjacent to the first terminal electrode 22 or the second terminal electrode 23 is interposed between the first terminal electrode 22 (or the second terminal electrode 23) and the n-type thermoelectric member 32 (or the p-type thermoelectric member 31).

(External Electrode 35 and Internal Electrode 34)

As shown in FIG. 2, each of the external electrodes 35 is in contact with the external peripheries of the p-type thermoelectric member 31 and the n-type thermoelectric member 32 which are adjacent to each other. As just described, each of the external electrodes 35 constitutes a part of the external periphery of the tubular thermoelectric generation device 21. On the other hand, each of the internal electrodes 34 is in contact with the internal peripheries of the n-type thermoelectric member 32 and the p-type thermoelectric member 31 which are adjacent to each other. Each of the internal electrodes 34 constitutes a part of the internal periphery of the tubular thermoelectric generation device 21. The external electrode 35 and the internal electrode 34 are disposed alternately along Z direction.

(External Electrode 35)

Figure 5A:
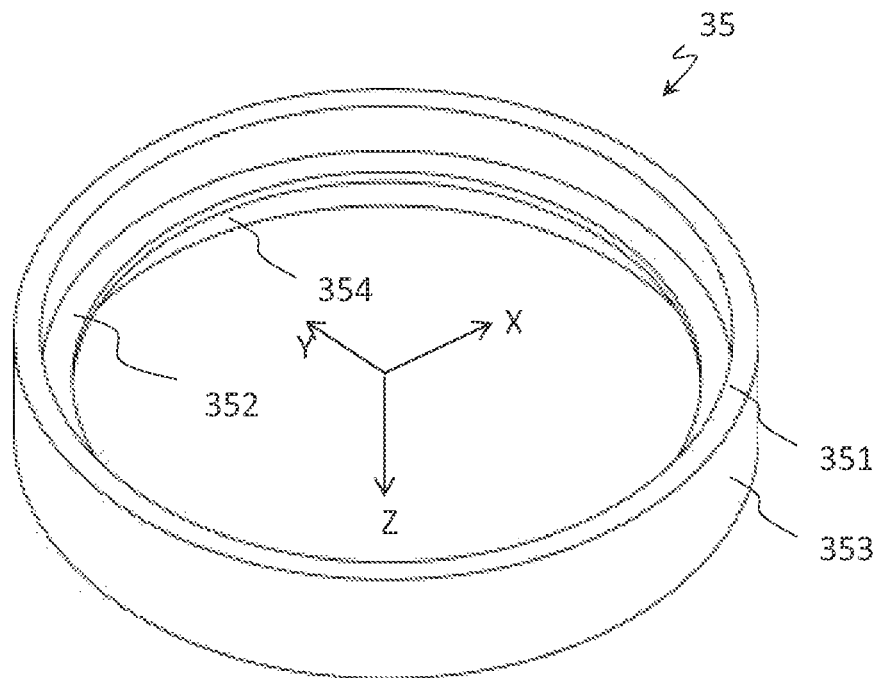
FIG. 5A shows a schematic view of an external electrode.
Figure 5B:
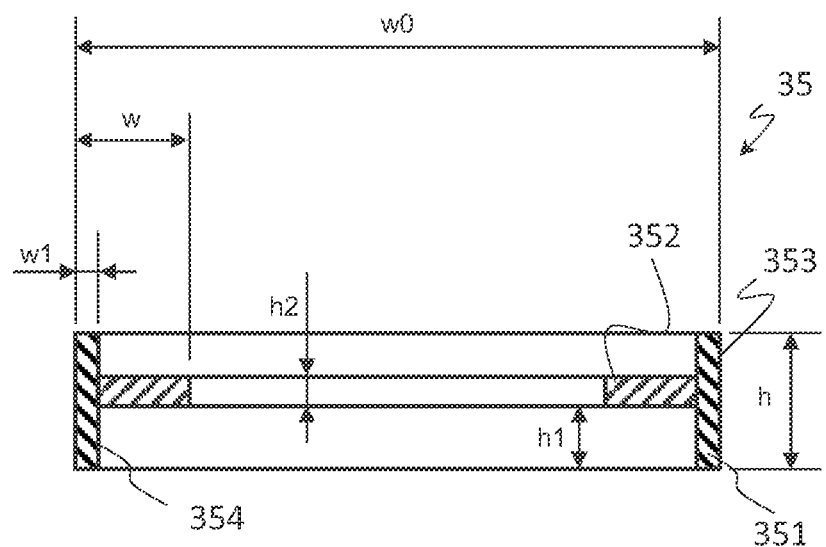
FIG. 5B shows a cross-sectional view of the external electrode.

As shown in FIG. 5A, the external electrode 35 comprises an internal flange 352. Specifically, the external electrode 35 comprises an external electrode main body 351 formed of an electrically conductive material such as a metal and the internal flange 352. It is desirable that the external electrode 35 is a hollow electrode having a shape of a column or a prism. The external electrode main body 351 has an external periphery 353 and an internal periphery 354. The internal flange 352 is expanded from the internal periphery 354 toward the center of the external electrode 35. FIG. 5B shows a cross-sectional view of the external electrode 35.

Figure 5C:
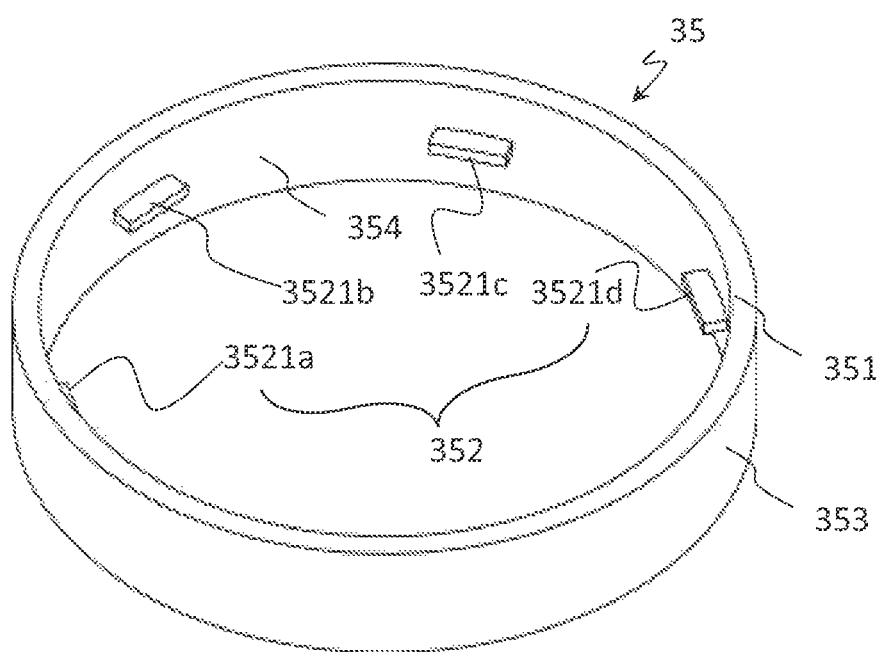
FIG. 5C shows the external electrode according to a first variation.

FIG. 5C shows the external electrode 35 according to a first variation. In FIG. 5A, the internal flange 352 has a shape of a ring; however, as shown in FIG. 5C, the internal flange 352 may be divided into two or more internal flange fragments 3521a-3521d.

Figure 5D:
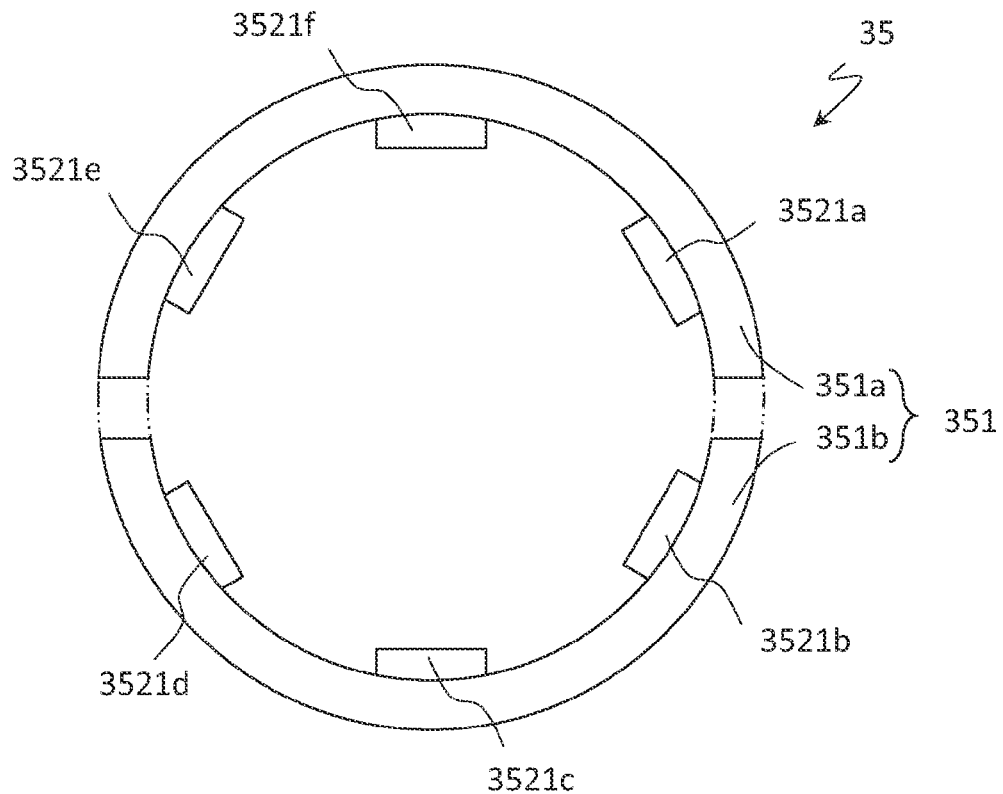
FIG. 5D shows the external electrode according to a second variation.

FIG. 5D shows a top view of the external electrode 35 according to a second variation. As shown in FIG. 5D, the external electrode main body 351 may be divided into two or more external electrode main body portions 351a-351b. In this case, the internal flange 352 is divided into two or more internal flange fragments 3521a-3521f.

Figure 5E:
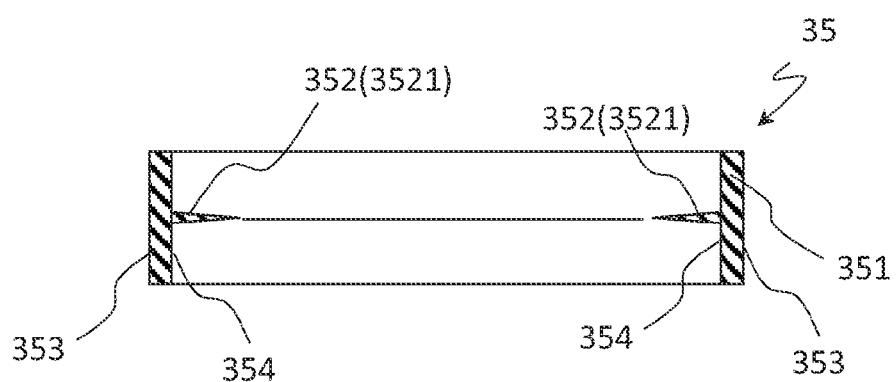
FIG. 5E shows a cross-sectional view of an internal flange in the first variation.

FIG. 5E shows a cross-sectional view of a variation of the internal flange 352. In FIG. 5A-FIG. 5D, the thickness of the internal flange 352 is constant; however, as shown in FIG. 5E, the thickness of the internal flange 352 may be decreased from the internal periphery 354 of the external electrode 35 toward the inside of the external electrode 35 (namely, toward the center of the external electrode 35). In other words, the thickness of the internal flange 352 may be decreased in a direction from the external periphery 311 toward the internal periphery 313 of the p-type thermoelectric member 31.

(Internal Electrode 34)

Figure 6A:
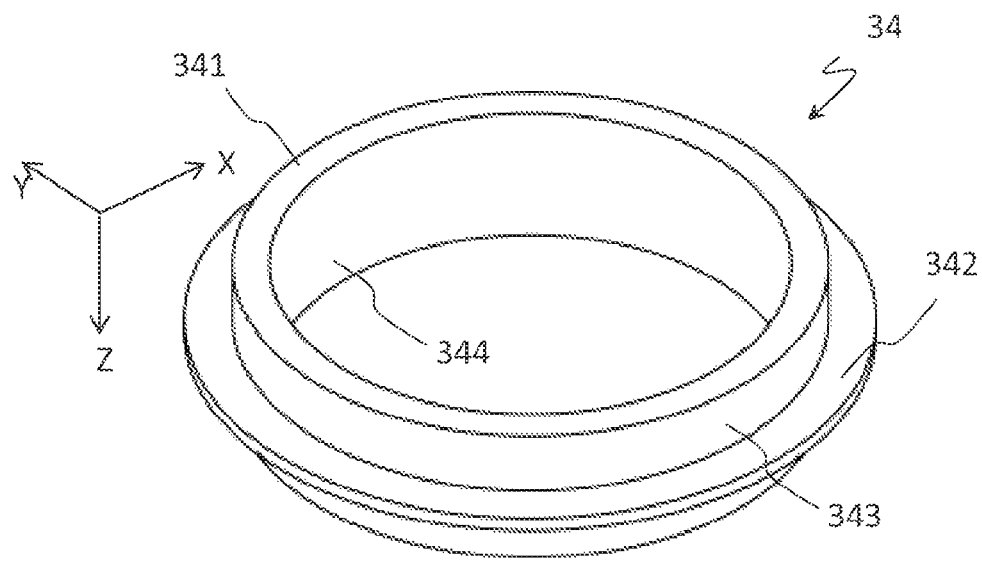
FIG. 6A shows a schematic view of an internal electrode.
Figure 6B:
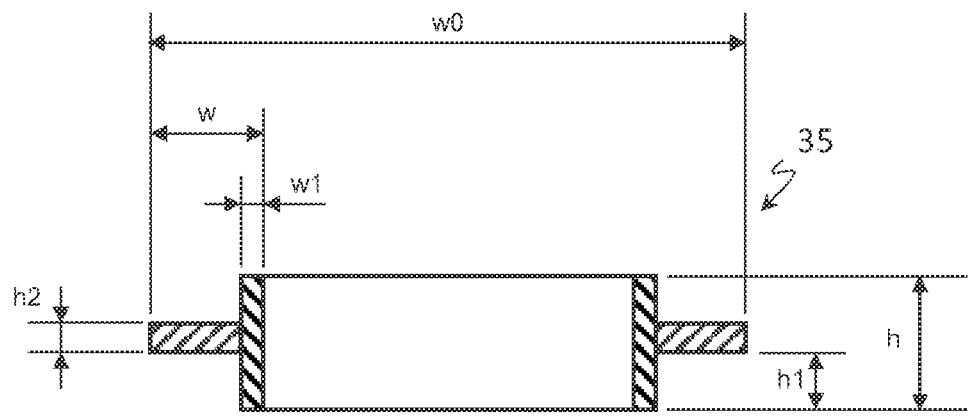
FIG. 6B shows a cross-sectional view of the internal electrode.

As shown in FIG. 6A, the internal electrode 34 comprises an external flange 342. Specifically, the internal electrode 34 comprises an internal electrode main body 341 formed of an electrically conductive material such as a metal and the external flange 342. It is desirable that the internal electrode 34 is a hollow electrode having a shape of a column or a prism. The internal electrode main body 341 has an external periphery 343 and an internal periphery 344. The external flange 342 is expanded from the external periphery 353 toward a direction away from the center of the internal electrode 34.

Figure 6C:
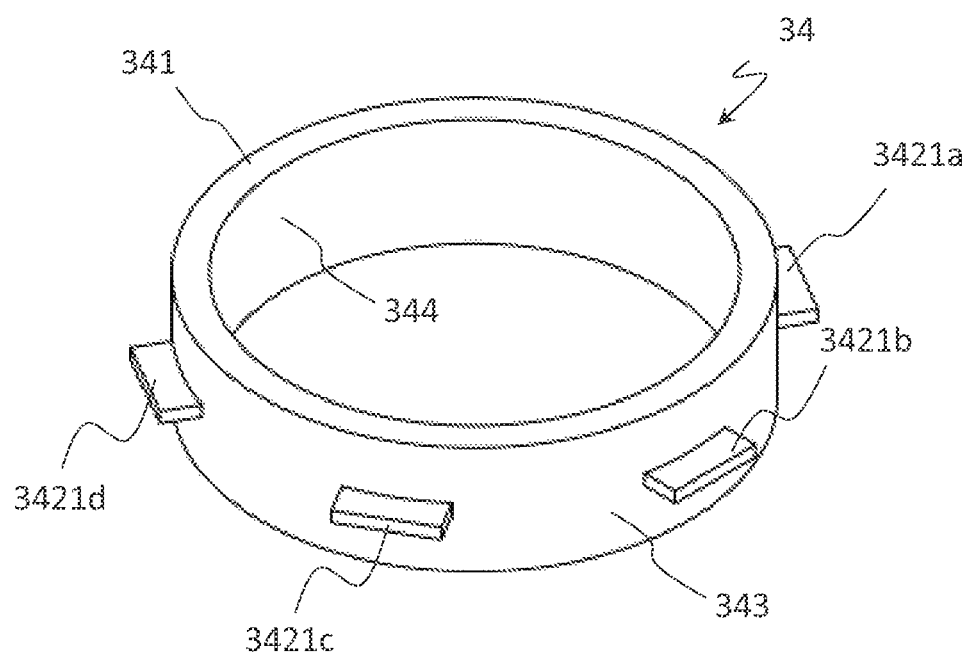
FIG. 6C shows the internal electrode according to the first variation.

FIG. 6C shows the internal electrode 34 according to a first variation. In FIG. 6A, the external flange 342 has a shape of a ring; however, as shown in FIG. 6C, the external flange 342 may be divided into two or more external flange fragments 3421a-3421d.

Figure 6D:
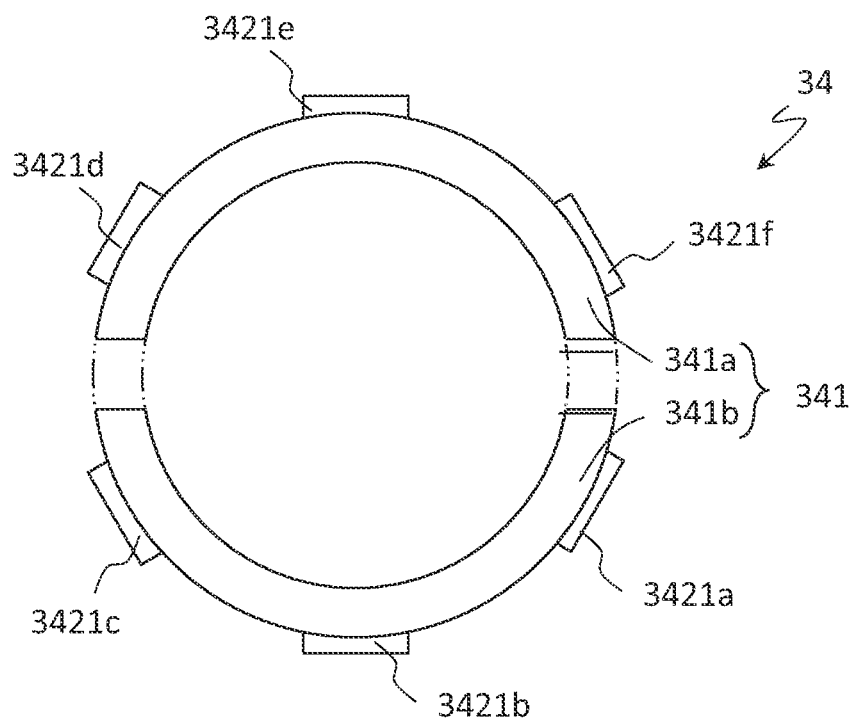
FIG. 6D shows the internal electrode according to the second variation.

FIG. 6D shows the internal electrode 34 according to a second variation. As shown in FIG. 6D, the internal electrode main body 341 may be divided into two or more internal electrode main body portions 341a-341b. In this case, the external flange 342 is divided into two or more external flange fragments 3421a-3421f.

Figure 6E:
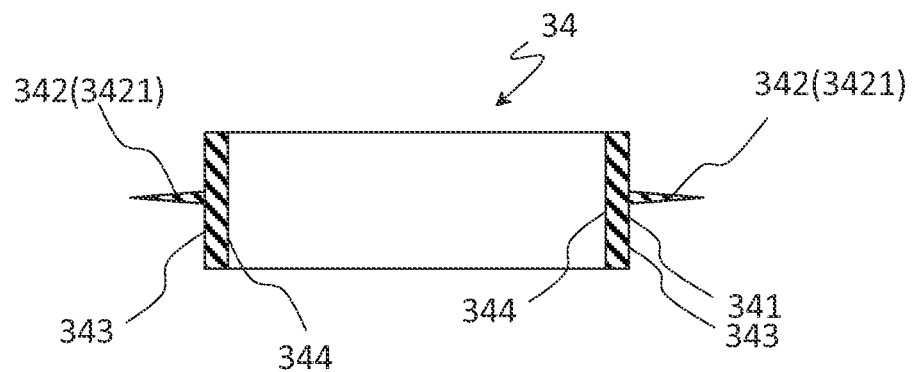
FIG. 6E shows a cross-sectional view of an external flange in the first variation.

FIG. 6E shows a cross-sectional view of a variation of the external flange 342. In FIG. 6A-FIG. 6D, the thickness of the external flange 342 is constant; however, as shown in FIG. 6E, the thickness of the external flange 342 may be decreased from the external periphery 343 of the internal electrode 34 toward the outside thereof. In other words, the thickness of the external flange 342 may be decreased in a direction from the internal periphery 313 toward the external periphery 311 of the p-type thermoelectric member 31.

Figure 7:
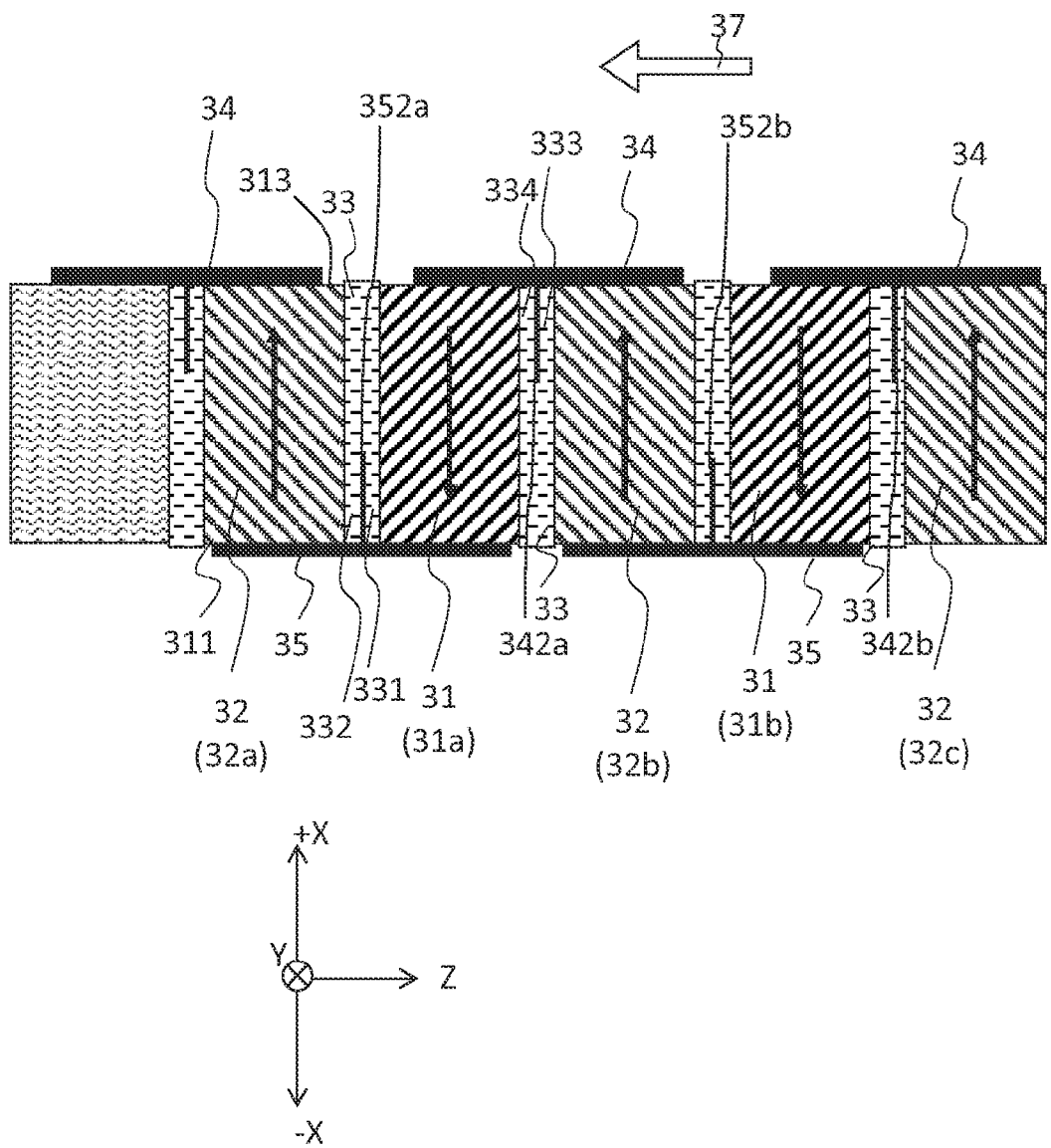
FIG. 7 shows an enlarged cross-sectional view of the part surrounded by a rectangle indicated by a dotted line included in FIG. 2.

FIG. 7 shows an enlarged cross-sectional view of the part surrounded by a rectangle indicated by a dotted line included in FIG. 2. As shown in FIG. 7, the internal flange 352 is interposed between the p-type thermoelectric member 31 and the n-type thermoelectric member 32 which are adjacent to each other. On the other hand, the external flange 342 is interposed between the n-type thermoelectric member 32 and another p-type thermoelectric member 32 which are adjacent to each other.

Hereinafter, this will be described in more detail. As shown in FIG. 7, the p-type thermoelectric members 31 include a first p-type thermoelectric member 31a and a second p-type thermoelectric member 31b. Similarly, the n-type thermoelectric members 32 include a first n-type thermoelectric member 32a and a second n-type thermoelectric member 32b. It is desirable that the n-type thermoelectric members 32 further include a third n-type thermoelectric member 32c. The second n-type thermoelectric member 32b is interposed between the first p-type thermoelectric member 31a and the second p-type thermoelectric member 31b. The first p-type thermoelectric member 31a is interposed between the first n-type thermoelectric member 32a and the second n-type thermoelectric member 32b.

An internal flange 352a is interposed between the first n-type thermoelectric member 32a and the first p-type thermoelectric member 31a. An external flange 342a is interposed between the first p-type thermoelectric member 31a and the second n-type thermoelectric member 32b. Another internal flange 352b is interposed between the second n-type thermoelectric member 32b and the second p-type thermoelectric member 31b. Another external flange 342b is interposed between the second p-type thermoelectric member 31b and the third n-type thermoelectric member 32c. As just described, the internal flanges 352 and the external flanges 342 are disposed alternately. The internal flange 352a and the internal flange 352b are referred to as a first internal flange 352a and a second internal flange 352b, respectively. Similarly, the external flange 342a and the external flange 342b are referred to as a second external flange 342a and a second external flange 342b, respectively.

As shown in FIG. 7, the internal flange 352 is expanded in a direction from the external periphery 311 of the p-type thermoelectric member 31 toward the internal periphery 313 thereof (namely, in +X direction). On the other hand, the external flange 342 is expanded in a direction from the internal periphery 313 of the p-type thermoelectric member 31 toward the external periphery 311 thereof (namely, in −X direction).

In the first embodiment, both the internal flange 352 and the external flange 342 are formed of an electrically conductive material. For this reason, it is desirable that the internal flange 352 is formed integrally with the external electrode main body 351 formed of an electrically conductive material. Similarly, it is desirable that the external flange 342 is formed integrally with the internal electrode main body 341 formed of an electrically conductive material.

It is undesirable that the internal flange 352 formed of an electrically conductive material is in contact with at least one of the p-type thermoelectric member 31 and the n-type thermoelectric member 32. This is because the power generation amount of the tubular thermoelectric generation device 21 is decreased. Therefore, a first insulation film 331 is interposed between the internal flange 352 and the p-type thermoelectric member 31, and a second insulation film 332 is interposed between the internal flange 352 and the n-type thermoelectric member 32. Similarly, it is undesirable that the external flange 342 formed of an electrically conductive material is in contact with at least one of the p-type thermoelectric member 31 and the n-type thermoelectric member 32. This is because the power generation amount of the tubular thermoelectric generation device 21 is decreased. Therefore, a third insulation film 333 is interposed between the external flange 342 and the n-type thermoelectric member 32, and a fourth insulation film 334 is interposed between the external flange 342 and the p-type thermoelectric member 31.

As is demonstrated in the examples which will be described later, since the external electrode 35 and the internal electrode 34 comprise the internal flange 352 and the external flange 342 respectively, the tubular thermoelectric generation device 21 according to the first embodiment has higher power generation efficiency than a conventional tubular thermoelectric generation device comprising an electrode which does not have a flange.

Figure 8:
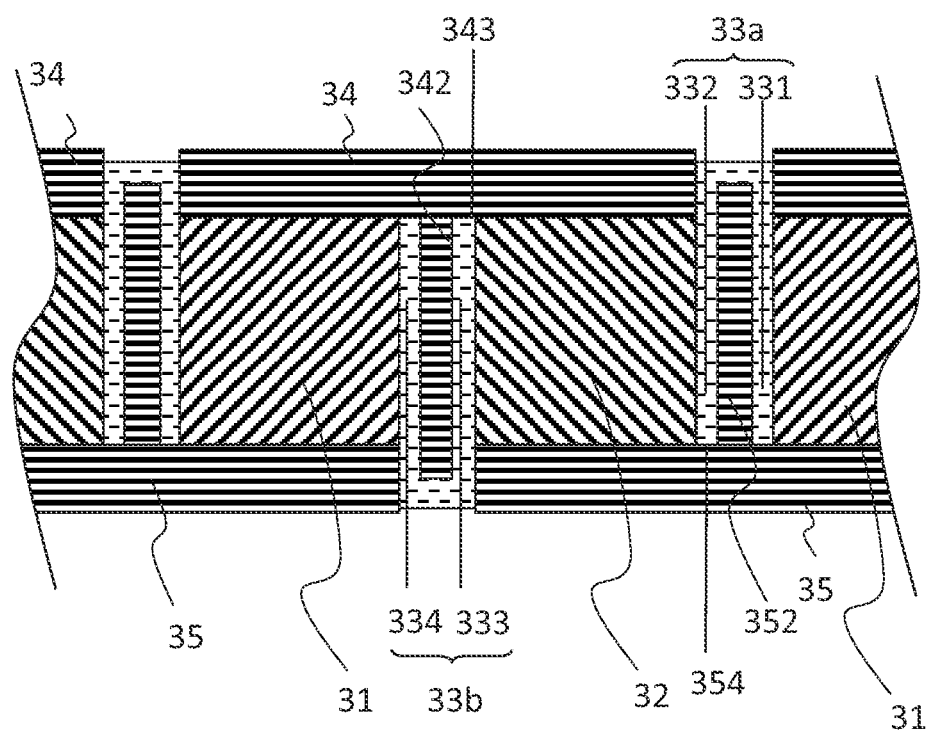
FIG. 8 shows an enlarged cross-sectional view of the tubular thermoelectric generation device.
Figure 9:
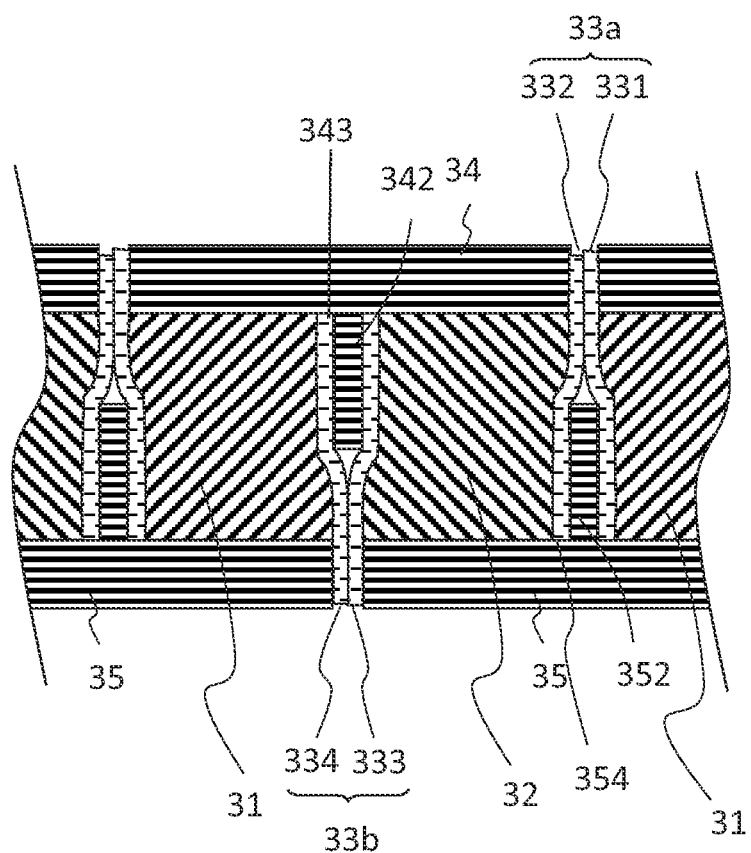
FIG. 9 shows an enlarged cross-sectional view of the tubular thermoelectric generation device.
Figure 10:
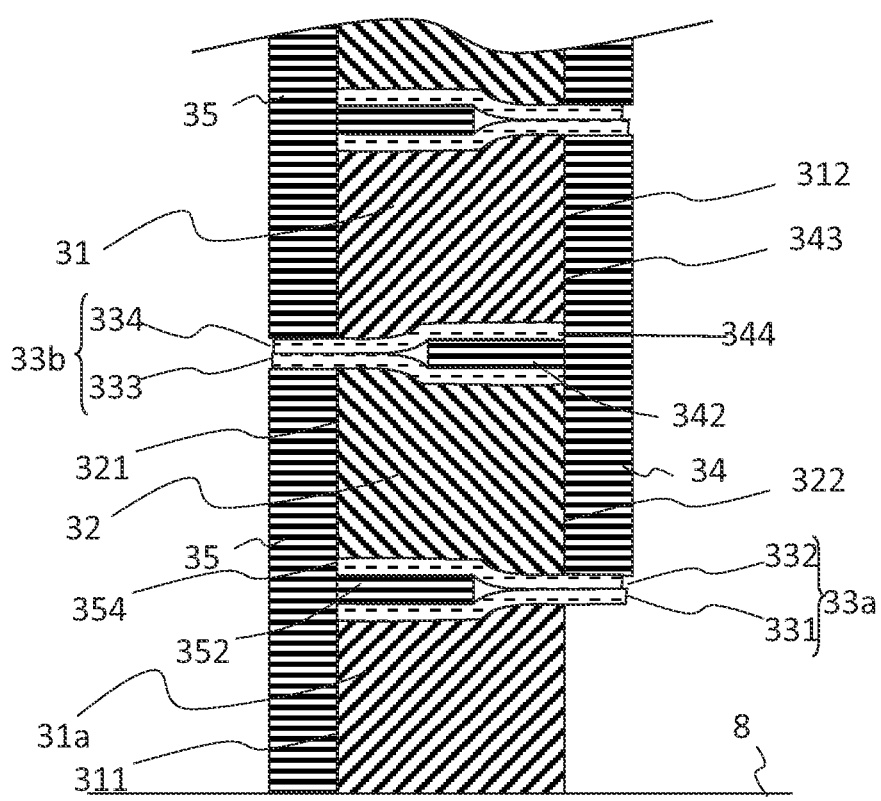
FIG. 10 is a drawing used to explain how to fabricate the tubular thermoelectric generation device.

As shown in FIG. 8-FIG. 10, it is desirable that an insulator 33 is interposed between the p-type thermoelectric member 31 and the n-type thermoelectric member 32. A plurality of insulators 33 are provided. It is desirable that each insulator 33 is plate-like. The plurality of insulators 33 include a first insulator and a second insulator. In order to distinguish the first insulator from the second insulator, hereinafter, the first insulator and the second insulator are referred to as the first insulator 33a and the second insulator 33b, respectively.

One end of the first insulator 33a is divided into two parts, namely, the first insulation film 331 and the second insulation film 332. The internal flange 352 is interposed between the first insulation film 331 and the second insulation film 332. The side of the first insulator 33a is in contact with the internal periphery 354 of the external electrode 35. As just described, it is desirable that the internal flange 352 is inserted from the side of the first insulator 33a which is in contact with the internal periphery 354 of the external electrode 35 into the inside of the first insulator 33a.

Similarly, one end of the second insulator 33b is divided into two parts, namely, the third insulation film 333 and the fourth insulation film 334. The external flange 342 is interposed between the third insulation film 333 and the fourth insulation film 334. The side of the second insulator 33b is in contact with the internal periphery 344 of the internal electrode 34. As just described, it is desirable that the external flange 342 is inserted from the side of the second insulator 33b which is in contact with the external periphery 343 of the internal electrode 34 into the inside of the second insulator 33b.

It is desirable that the second insulator 33b is interposed between the two adjacent external electrodes 35 from the viewpoint of improving the insulation between the two adjacent external electrodes 35 and from the viewpoint of preventing the fluid flowing through the flow path formed of the through hole B1 from eroding the p-type thermoelectric member 31 and the n-type thermoelectric member 32. Similarly, it is desirable that the first insulator 33a is interposed between the two adjacent internal electrodes 34.

As shown in FIG. 8, the end (the upper end, in FIG. 8) of the internal flange 352 may be interposed between the two adjacent internal electrodes 34. Similarly, the end (the lower end, in FIG. 8) of the external flange 342 may be interposed between the two adjacent external electrodes 35.

As shown in FIG. 9, the first insulator 33a may be composed of the first insulation film 331 and the second insulation film 332. Similarly, the second insulator 33b may be composed of the third insulation film 333 and the fourth insulation film 334. In this case, the first insulation film 331 has a front surface and a back surface. The front surface of the first insulation film 331 is in contact with the p-type thermoelectric member 31. The second insulation film 332 also has a front surface and a back surface. The front surface of the second insulation film 332 is in contact with the n-type thermoelectric member 32. A part of the back surface of the first insulation film 331 is in contact with a part of the back surface of the second insulation film 332. The other part of the back surface of the first insulation film 331 is in contact with the internal flange 352. The other part of the back surface of the second insulation film 332 is also in contact with the internal flange 352.

Similarly, the third insulation film 333 has a front surface and a back surface. The front surface of the third insulation film 333 is in contact with the n-type thermoelectric member 32. The fourth insulation film 334 also has a front surface and a back surface. The front surface of the fourth insulation film 334 is in contact with the p-type thermoelectric member 31. A part of the back surface of the third insulation film 333 is in contact with a part of the back surface of the fourth insulation film 334. The other part of the back surface of the third insulation film 333 is contact with the external flange 342. The other part of the back surface of the fourth insulation film 334 is also in contact with the external flange 342.

Also in FIG. 9, the internal flange 352 is inserted from the side of the first insulator 33a (i.e., the internal periphery 354 of the external electrode 35) into the inside of the first insulator 33a. The external flange 342 is inserted from the side of the second insulator 33b (i.e., the external periphery 343 of the internal electrode 34) into the inside of the second insulator 33b.

As shown in FIG. 1, FIG. 3A, and FIG. 4A, it is desirable that each of the p-type thermoelectric member 31 and the n-type thermoelectric member 32 has a shape of a ring. In this case, it is desirable that each of the external electrode main bodies 351, the internal electrode main bodies 341, and the first to fourth insulation films 331 to 334 also has a shape of a ring. Another example of the shape of the p-type thermoelectric member 31 and the n-type thermoelectric member 32 is a polygon such as a triangle, a quadrangle, a pentagon or a hexagon, or an ellipse. Each of the external electrode main bodies 351, the internal electrode main bodies 341, and the first to fourth insulation films 331 to 334 has the same shape as the p-type thermoelectric member 31 and the n-type thermoelectric member 32.

(Fabrication Method)

Next, an example of a method for fabricating the tubular thermoelectric generation device 21 will be briefly described with reference to FIG. 10.

First, the first p-type thermoelectric member 31a is disposed on a flat plane 8. Then, the first insulation film 331 is disposed on the first p-type thermoelectric member 31a. Then, the external electrode 35 is disposed on the first insulation film 331 so that the internal periphery 354 of the external electrode 35 is in contact with the side of the first insulation film 331 and the external periphery 311 of the first p-type thermoelectric member 31a. The lower surface of the internal flange 352 is in contact with the upper surface of the first insulation film 331.

The second insulation film 332 is disposed on the internal flange 352 so that the side of the second insulation film 332 is in contact with the internal periphery 354 of the external electrode 35. The lower surface of the second insulation film 332 is in contact with the upper surface of the internal flange 352. In FIG. 10, the upper surface of the right part of the first insulation film 331 is in contact with the lower surface of the right part of the second insulation film 332; however, it is unnecessary that the first insulation film 331 is in contact with the second insulation film 332.

The n-type thermoelectric member 32 is disposed on the second insulation film 332 so that the external periphery 321 of the n-type thermoelectric member 32 is in contact with the internal periphery 354 of the external electrode 35. Then, the third insulation film 333 is disposed on the n-type thermoelectric member 32 so that one end (the left end, in FIG. 10) of the third insulation film 333 is in contact with the external electrode 35. Furthermore, the internal electrode 34 is disposed on the third insulation film 333 so that the internal periphery 323 of the n-type thermoelectric member 31 is in contact with the external periphery 343 of the internal electrode 34. The lower surface of the external flange 342 is in contact with the upper surface of the third insulation film 333.

The fourth insulation film 334 is disposed on the external flange 342 so that the side of the fourth insulation film 334 is in contact with the external periphery 343 of the internal electrode 34. The lower part of the fourth insulation film 334 is in contact with the upper surface of the external flange 342. In FIG. 10, the upper surface of the left part of the third insulation film 333 is in contact with the lower part of the left part of the fourth insulation film 334; however, it is unnecessary that the third insulation film 333 is in contact with the fourth insulation film 334.

Figure 12:
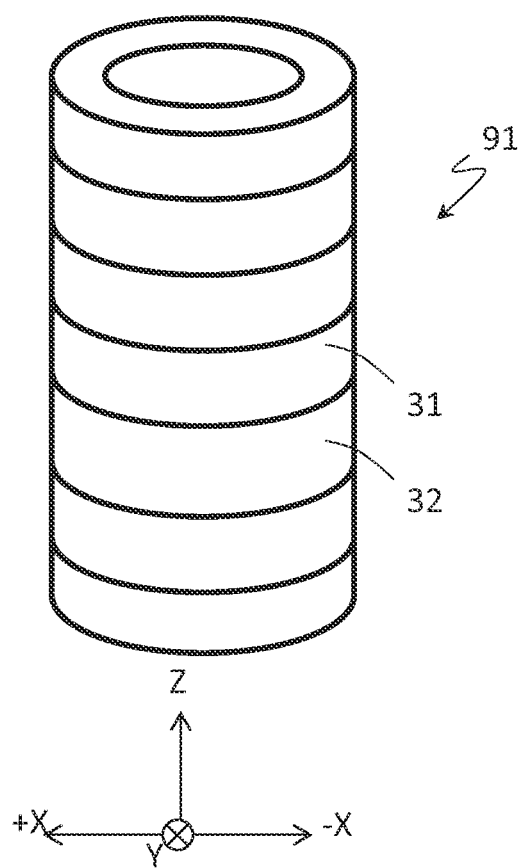
FIG. 12 shows a schematic view of a stacked structure.

The p-type thermoelectric member 31 is disposed on the fourth insulation film 334 so that the internal periphery 313 of the p-type thermoelectric member 31 is in contact with the external periphery 343 of the internal electrode 34. This is repeated. In this way, a stacked structure 91 shown in FIG. 12 is provided. In FIG. 12, note that the external electrode 35 is not illustrated.

Then, while the stacked structure 91 is compressed along Z direction, the stacked structure 91 is heated. This causes the p-type thermoelectric member 31, the n-type thermoelectric member 32, the external electrode 35, and the internal electrode 34 to adhere to one another. In this way, the tubular thermoelectric generation device 21 is provided. Finally, as shown in FIG. 1, the first terminal electrode 22 and the second terminal electrode 23 are attached to both ends of the tubular thermoelectric generation device 21. In this way, the tubular thermoelectric conversion device 100 is provided.

As demonstrated in the examples which will be described later, since the external electrode 35 and the internal electrode 34 comprise the internal flange 352 and the external flange 342 respectively, the p-type thermoelectric members 31, the n-type thermoelectric members 32, the external electrodes 35, and the internal electrodes 34 hardly move in a direction perpendicular to the axis direction (namely, in +X direction, −X direction, or Y direction, all of which are perpendicular to Z direction) while the stacked structure 91 is heated with being compressed along Z direction. For this reason, the provided tubular thermoelectric generation device 21 according to the first embodiment has higher power generation efficiency than a conventional tubular thermoelectric generation device comprising an electrode which does not have such a flange.

Optionally, solder may be used to ensure electrical connection of the p-type thermoelectric members 31, the n-type thermoelectric members 32, the external electrodes 35, and the internal electrodes 34.

(Electric Power Generation Method)

Figure 13:
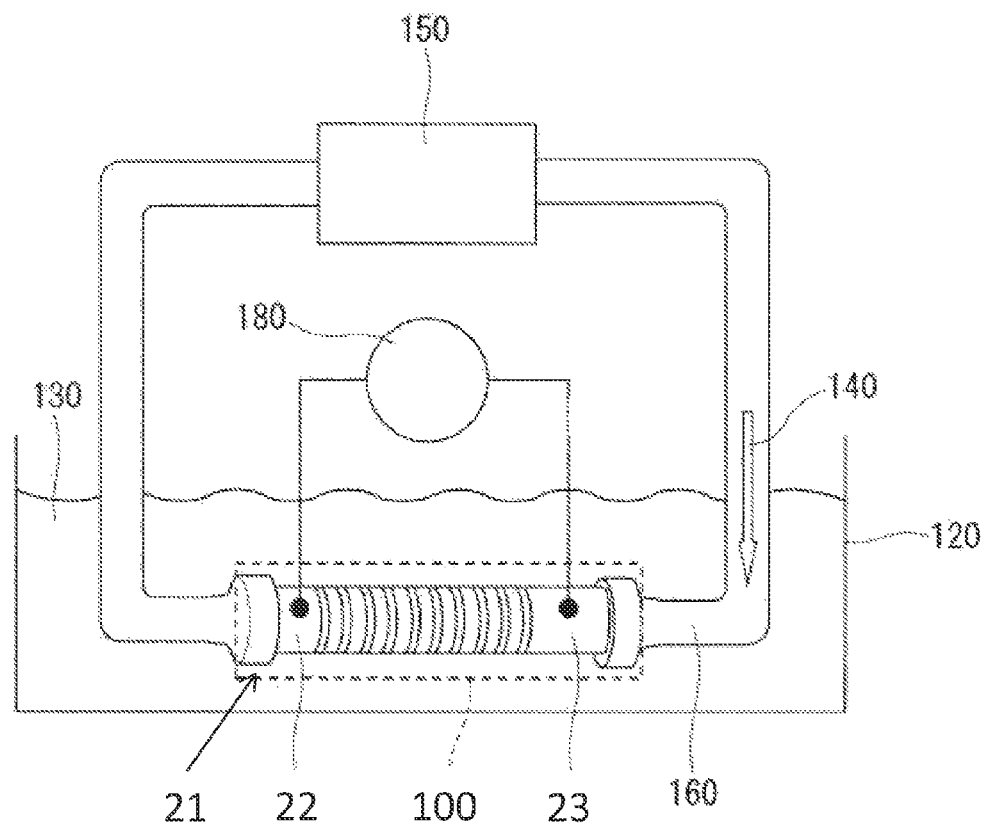
FIG. 13 shows a schematic view of inventive examples and comparative examples.
Figure 14:
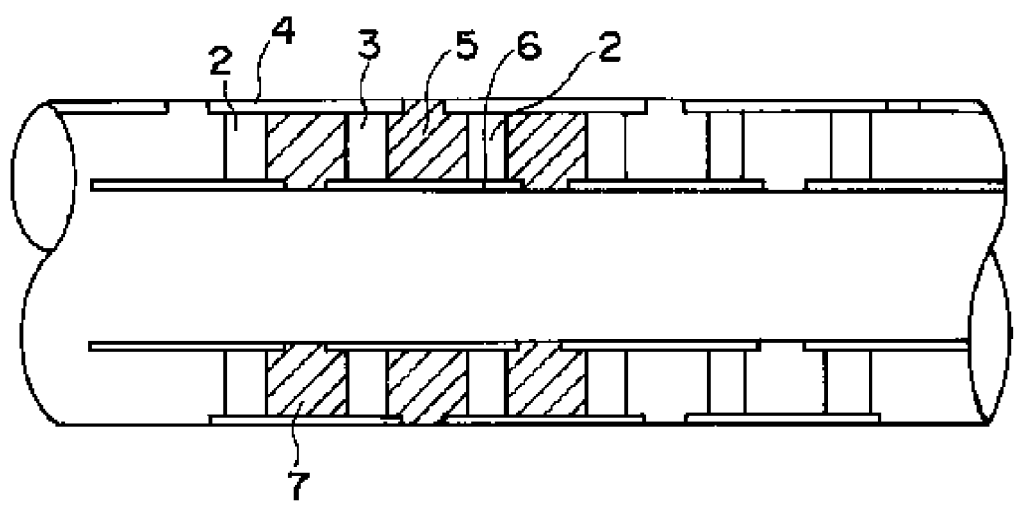
FIG. 14 shows a cross-sectional view of the integral ring type thermoelectric conversion element disclosed in Japanese Patent laid-open Publication No. Hei 07-106641A.

Finally, an electric power generation method using the tubular thermoelectric generation device 21 according to the first embodiment will be described. First, the tubular thermoelectric generation device 21 is prepared. In other words, a user gets ready for the tubular thermoelectric generation device 21. Then, as shown in FIG. 13, a fluid flows through the inside of the tubular thermoelectric generation device 21 (namely, through the through hole B1, not shown in FIG. 13). In particular, a hot fluid such as warm water is flowed through the inside of the tubular thermoelectric generation device 21 (namely, through the through hole B1). In this case, it is desirable that the tubular thermoelectric generation device 21 is surrounded by a cold fluid such as cold water or air. As shown in FIG. 13, it is more desirable that the tubular thermoelectric generation device 21 is immersed in cold water.

Instead, a cold fluid such as cold water or air may be flowed through the inside of the tubular thermoelectric generation device 21 (namely, through the through hole B1). In this case, it is desirable that the tubular thermoelectric generation device 21 is surrounded by a hot fluid such as warm water. As shown in FIG. 13, it is more desirable that the tubular thermoelectric generation device 21 is immersed in warm water. By the action of the temperature difference generated in this way between the inside and the outside of the tubular thermoelectric generation device 21, an electric potential difference is generated at both ends of the tubular thermoelectric generation device 21. This electric potential difference is extracted as electric power through the first terminal electrode 22 and the second terminal electrode 23.

(Second Embodiment)

In the second embodiment, both of the internal flange 352 and the external flange 342 are formed of an insulator. Also in the second embodiment, the internal flange 352 is formed integrally with the external electrode main body 351 formed of an electrically conductive material. Similarly, the external flange 342 is formed integrally with the internal electrode main body 341 formed of an electrically conductive material.

Unlike the case of the first embodiment, since both of the internal flange 352 and the external flange 342 are formed of an insulator in the second embodiment, the insulator 33 is unnecessary. In other words, the internal flange 352 and the external flange 342 each formed of an insulator function as the insulator 33.

Figure 11:
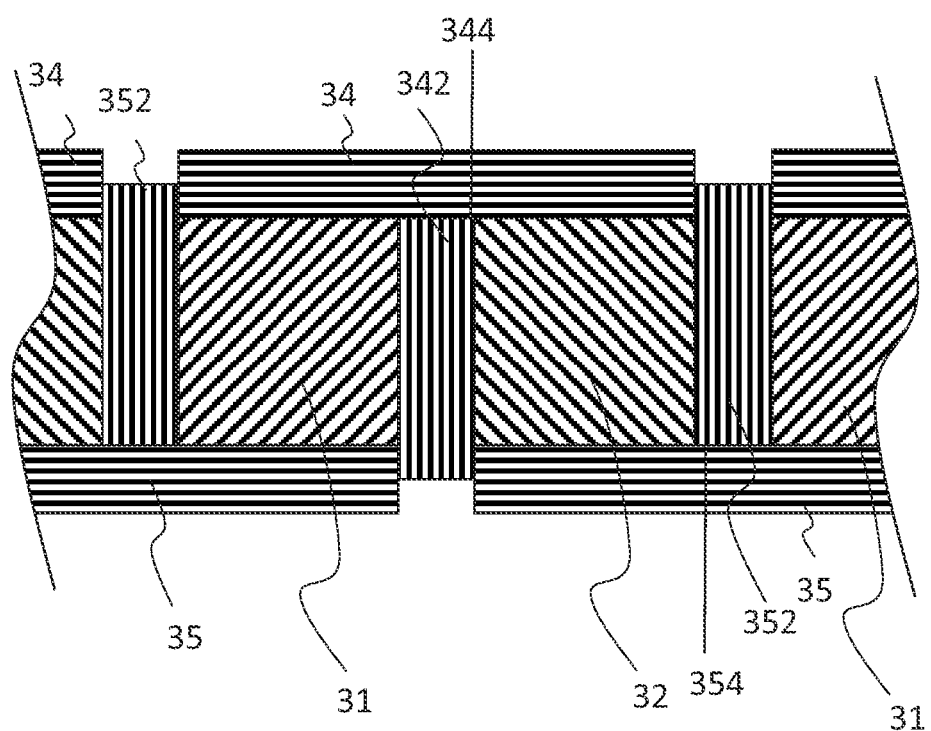
FIG. 11 shows an enlarged cross-sectional view of the tubular thermoelectric generation device in a second embodiment.

As shown in FIG. 11, it is desirable that the end of the external flange 342 formed of an insulator is interposed between the two adjacent internal electrodes 34 from the viewpoint of improving the insulation between the two adjacent internal electrodes 34 and from the viewpoint of preventing the fluid flowing through the flow path formed of the through hole B1 from eroding the p-type thermoelectric member 31 and the n-type thermoelectric member 32. Similarly, it is desirable that the end of the internal flange 352 formed of an insulator is interposed between the two adjacent external electrodes 35.

EXAMPLES

Hereinafter, the present invention will be described in more detail with reference to the following examples.

Inventive Example 1a

In the inventive example 1a, the p-type thermoelectric member 31 was formed of $Bi_{0.5}Sb_{1.5}Te_3$ (hereinafter, referred to as "BiSbTe"). The n-type thermoelectric member 32 was formed of $Bi_2Te_{2.85}Se_{0.15}$ (hereinafter, referred to as "BiTeSe").

A BiSeTe powder was prepared as below. First, BiSbTe flakes each having a shape of ribbon were provided from a commercially available BiSbTe ingot by a rapid solidification processing. In the rapid solidification processing, melted BiSbTe was sprayed onto a water-cooled rotating roll formed of copper. Then, the BiSbTe flakes were ground to provide the BiSeTe powder. A BiTeSe powder was provided from a commercially available BiTeSe ingot in a similar way.

First, the BiSbTe powder (average particle size: not less than 5 micrometers and not more than 100 micrometers) was solidified using a tablet machine to provide the p-type thermoelectric member 31 shown in FIG. 3. The provided p-type thermoelectric member 31 had an internal diameter of 10 millimeters, an external diameter of 14 millimeters, and a thickness of 1.3 millimeters.

Similarly, the BiTeSe powder (average particle size: not less than 5 micrometers and not more than 100 micrometers) was solidified using a tablet machine to provide the n-type thermoelectric member 32 shown in FIG. 4. The provided n-type thermoelectric member 32 also had an internal diameter of 10 millimeters, an external diameter of 14 millimeters, and a thickness of 1.3 millimeters.

A stainless steel plate was cut to provide the external electrode 35 shown in FIG. 5A and FIG. 5B. In the inventive example 1a, the external electrode 35 had the internal flange 352 formed of stainless steel. Similarly, the internal electrode 34 shown in FIG. 6A and FIG. 6B was fabricated. In the inventive example 1a, the internal electrode 34 had the external flange 342 formed of stainless steel. The following Table 1 shows heights h, h1, and h2 and widths w0, w, and w1 of these electrodes in the inventive example 1a.

TABLE 1

|  | Internal electrode 34 | (Unit: millimeter)<br>External electrode 35 |
|---|---|---|
| w0 | 14.6 | 14.6 |
| w | 2.6 | 2.6 |
| w1 | 0.3 | 0.3 |

TABLE 1-continued

|  | Internal electrode 34 | (Unit: millimeter)<br>External electrode 35 |
|---|---|---|
| h | 2.5 | 2.5 |
| h1 | 1.1 | 1.1 |
| h2 | 0.3 | 0.3 |

The first to fourth insulation films 331 to 334 formed of polyimide were prepared. Each of the first insulation film 331 and the second insulation film 332 had an internal diameter of 9.4 millimeters, an external diameter of 14.0 millimeters, and a thickness of 100 micrometers. Each of the third insulation film 333 and the fourth insulation film 334 had an internal diameter of 10.0 millimeters, an external diameter of 14.6 millimeters, and a thickness of 100 micrometers.

The thus-prepared p-type thermoelectric members 31, n-type thermoelectric members 32, external electrodes 35, internal electrodes 34, and first to fourth insulation films 331 to 334 were stacked as shown in FIG. 12 using a stick (not shown) covered with a carbon sheet having a thickness of 200 micrometers. In this way, a stacked structure 91 was obtained. The stick penetrated each of the through holes.

Next, the external periphery of the stacked structure 91 was covered with a carbon sheet having a thickness of 200 micrometers.

While the stacked structure 91 was compressed along Z direction at a pressure of 4.0 kN, the stacked structure 91 was heated at 420 degrees Celsius by a discharge plasma sintering method. In this way, the p-type thermoelectric members 31 and the n-type thermoelectric members 32 were sintered, and the external electrodes 35 and the internal electrodes 34 were joined to the p-type thermoelectric members 31 and the n-type thermoelectric members 32. Subsequently, the stacked structure 91 was cooled to room temperature. In this way, the stacked structure 91 was provided. The provided stacked structure 91 had a length of 35 millimeters. This was repeated three times to provide three stacked structures 91.

Solder was applied to the ends of each of the three stacked structures 91. Then, the three stacked structures 91 were connected in series. Next, an aluminum stick was inserted into the through hole B1 so that the aluminum stick penetrated the through hole B1. The three stacked structures 91 connected in series were heated under atmospheric pressure in a thermostatic bath maintained at 170 degrees Celsius for 40 minutes. In this way, the tubular thermoelectric generation device 21 having a length of approximately 110 millimeters was provided.

Finally, the first terminal electrode 22 and the second terminal electrode 23, both of which were formed of indium, were attached to the one end and the other end of the tubular thermoelectric generation device 21 respectively to provide the tubular thermoelectric conversion device 100.

As shown in FIG. 13, a siliocone tube 160 was connected to both the ends of the tubular thermoelectric conversion device 100. The tubular thermoelectric conversion device 100 was immersed in water 130 maintained at 10 degrees Celsius stored in a water tank 120. Warm water having a temperature of 90 degrees Celsius was supplied to the silicone tube 160. The warm water was circulated by a pump 150. A load 180 was electrically connected between the first terminal electrode 22 and the second terminal electrode 23.

As a result, in the inventive example 1a, a maximum electric power generation amount of 1.0 W was obtained.

Inventive Example 1b

In the inventive example 1b, an experiment similar to the inventive example 1a was conducted except that heights and widths of the external electrode 35 and the internal electrode 34 were different.

The following Table 2 shows the heights h, h1, and h2, and widths w0, w, and w1 of these electrodes in the inventive example 1b.

TABLE 2

|  | Internal electrode 34 | (Unit: millimeter)<br>External electrode 35 |
|---|---|---|
| w0 | 10.6 | 14.6 |
| w | 0.6 | 0.6 |
| w1 | 0.3 | 0.3 |
| h | 2.5 | 2.5 |
| h1 | 1.1 | 1.1 |
| h2 | 0.3 | 0.3 |

In the inventive example 1b, a maximum electric power generation amount of 4.0 W was obtained.

Inventive Example 1c

In the inventive example 1c, an experiment similar to the inventive example 1a was conducted except that different external electrodes 35 and internal electrodes 34 were used.

First, in the inventive example 1c, a ring-shaped polyimide film was prepared. The ring-shaped polyimide film was plated with nickel to provide the external electrode 35. The ring-shaped polyimide film served as the internal flange 352. The external electrode main body 351 was formed of nickel. The internal electrode 34 was also fabricated in a similar way. In other words, the internal electrode 34 was composed of the internal electrode main body 341 formed of nickel and the external flange 342 formed of polyimide.

In the inventive example 1c, a maximum electric power generation amount of 5.0 W was obtained.

Furthermore, in the inventive example 1c, the tubular thermoelectric conversion device 100 was drawn up from the water tank 120. Then, while water having a temperature of 20 degrees Celsius was supplied to the silicone tube 160 in the atmosphere, an electric current of 10 amperes flowed through the tubular thermoelectric conversion device 100 via the first terminal electrode 22 and the second terminal electrode 23. After one minute from the start of the electric current application, the tubular thermoelectric conversion device 100 had a surface temperature of −5 degrees Celsius. As just described, the tubular thermoelectric conversion device 100 cooled by application of an electric current.

Comparative Example 1

In the comparative example 1, an experiment similar to the inventive example 1a was conducted except that the external electrodes 35 and the internal electrodes 34 did not have the internal flanges 352 and the external flanges 342 respectively.

The following Table 3 shows heights h, h1, and h2, and widths w0, w, and w1 of these electrodes in the comparative example 1.

TABLE 3

|  | Internal electrode 34 | (Unit: millimeter) External electrode 35 |
|---|---|---|
| w0 | 10 | 14.6 |
| w | 0.3 | 0.3 |
| w1 | 0.3 | 0.3 |
| h | 2.1 | 2.1 |
| h1 | — | — |
| h2 | — | — |

In the comparative example 1, a maximum electric power generation amount of 0.3 W was obtained. Furthermore, similarly to the case of the inventive example 1c, an electric current of 10 amperes flowed; however, the surface temperature of the tubular thermoelectric conversion device 100 remained 20 degrees Celsius.

The results of the inventive examples 1a-1c and the comparative example 1 are shown in the following Table 4.

TABLE 4

|  | maximum electric power generation amount |
|---|---|
| Inventive example 1a | 1.0 |
| Inventive example 1b | 4.0 |
| Inventive example 1c | 5.0 |
| Comparative example 1 | 0.3 |

Inventive Example 2

In the inventive example 2, an experiment similar to the inventive example 1a was conducted except that the external electrodes 35 and the internal electrodes 34 were formed of nickel.

In the inventive example 2, a maximum electric power generation amount of 4.0 W was obtained.

Comparative Example 2

In the comparative example 2, an experiment similar to the comparative example 1 was conducted except that the external electrodes 35 and the internal electrodes 34 were formed of nickel.

In the comparative example 2, a maximum electric power generation amount of 0.6 W was obtained.

The results of the inventive example 2 and the comparative example 2 are shown in the following Table 5.

TABLE 5

|  | maximum electric power generation amount |
|---|---|
| Inventive example 2 | 4.0 |
| Comparative example 2 | 0.6 |

Inventive Example 3

In the inventive example 3, an experiment similar to the inventive example 1a was conducted except that different external electrodes 35 and internal electrodes 34 were used.

First, in the inventive example 3, the external electrodes 35 and the internal electrodes 34 each formed of cobalt were fabricated by a lost-wax process. Each of the external electrodes 35 had the internal flange 352 formed of cobalt. Similarly, each of the internal electrodes 34 had the external flange 342 formed of cobalt. Then, each of the external electrodes 35 and the internal electrodes 34 was covered with a diamond carbon film having a thickness of 5 micrometers with the exception of a portion in which electrical connection with the p-type thermoelectric member 31 and the n-type thermoelectric member 32 was required. The p-type thermoelectric members 31 and the n-type thermoelectric members 32 were covered with an yttria-stabilized zirconia film with the exception of a portion in which electrical connection with the external electrodes 35 and the internal electrodes 34 was required. In the inventive example 3, the first to fourth insulation films 331 to 334 each formed of polyimide were not used.

In the inventive example 3, a maximum electric power generation amount of 1.0 W was obtained.

Comparative Example 3

In the comparative example 3, an experiment similar to the comparative example 1 was conducted except that the external electrodes 35 and the internal electrodes 34 were formed of cobalt.

In the comparative example 3, a maximum electric power generation amount of 0.3 W was obtained.

The results of the inventive example 3 and the comparative example 3 are shown in the following Table 6.

TABLE 6

|  | maximum electric power generation amount |
|---|---|
| Inventive example 3 | 1.0 |
| Comparative example 3 | 0.3 |

Inventive Example 4

In the inventive example 4, an experiment similar to the inventive example 1b was conducted except that:

(1) the p-type thermoelectric member 31 was formed of $Pb_{0.6}Sn_{0.4}Te$;

(2) the n-type thermoelectric member 32 was formed of PbTe doped with 10% by weight of $PbI_2$; and (3) the p-type thermoelectric member 31 and the n-type thermoelectric member 32 were covered with an yttria-stabilized zirconia film with the exception of a portion in which electrical connection with the external electrodes 35 and the internal electrodes 34 was required.

In the inventive example 4, a maximum electric power generation amount of 1.0 W was obtained.

Comparative Example 4

In the comparative example 4, an experiment similar to the inventive example 4 was conducted except that the external electrodes 35 and the internal electrodes 34 used in the comparative example 1 were employed.

In the comparative example 4, a maximum electric power generation amount of 0.15 W was obtained.

The results of the inventive example 4 and the comparative example 4 are shown in the following Table 7.

TABLE 7

|  | maximum electric power generation amount |
|---|---|
| Inventive example 4 | 0.5 |
| Comparative example 4 | 0.15 |

As is clear from these inventive examples and comparative examples, the tubular thermoelectric generation device 21 in which each of the external electrodes 35 and the internal electrodes 34 comprises the internal flange 352 and the external flange 342 respectively has higher power generation efficiency than the tubular thermoelectric generation devices according to the comparative examples.

INDUSTRIAL APPLICABILITY

Electric power is provided using the tubular thermoelectric generation device according to the present invention.

REFERENCE SIGNS LIST 100 tubular thermoelectric conversion device
    L axis
    B1 through hole
21 tubular thermoelectric generation device
22 first terminal electrode
23 second terminal electrode
31 p-type thermoelectric member
    311 external periphery
    312 through hole
    313 internal periphery
32 n-type thermoelectric member
    321 external periphery
    322 through hole
    323 internal periphery
33 insulator
    33a first insulator
    33b second insulator
    331 first insulation film
    332 second insulation film
    333 third insulation film
    334 fourth insulation film
34 internal electrode
    341 internal electrode main body
    342 external flange
    3421 external flange fragment
    343 external periphery
    344 internal periphery
35 external electrode
    351 external electrode main body
    352 internal flange
    3521 internal flange fragment
    353 external periphery
    354 internal periphery
120 water tank
130 water
150 pump
160 silicone tube
180 load

The invention claimed is:

1. A tubular thermoelectric generation device, comprising:
a plurality of plate-like p-type thermoelectric members each having an external periphery, a through hole, and an internal periphery formed around the through hole;
a plurality of plate-like n-type thermoelectric members each having an external periphery, a through hole, and an internal periphery formed around the through hole;
a plurality of external electrodes; and
a plurality of internal electrodes,
wherein
the plurality of plate-like p-type thermoelectric members and the plurality of plate-like n-type thermoelectric members are disposed alternately along an axis direction of the tubular thermoelectric generation device so that each through hole of the plurality of plate-like p-type thermoelectric members and each through hole of the plurality of plate-like n-type thermoelectric members overlap each other;
each of the plurality of the external electrodes is in contact with the external peripheries of the p-type thermoelectric member and the n-type thermoelectric member which are adjacent to each other;
each of the plurality of the internal electrodes is in contact with the internal peripheries of the p-type thermoelectric member and the n-type thermoelectric member which are adjacent to each other;
the plurality of external electrodes and the plurality of internal electrodes are disposed alternately along the axis direction of the tubular thermoelectric generation device;
each of the plurality of the external electrodes comprises an internal flange expanded in a direction from the external periphery of the p-type thermoelectric member toward the internal periphery of the p-type thermoelectric member;
each of the internal flanges is interposed between the p-type thermoelectric member and the n-type thermoelectric member which are adjacent to each other;
each of the internal flanges is formed of an electrically conductive material;
a first insulation film is interposed between the internal flange and the p-type thermoelectric member;
a second insulation film is interposed between the internal flange and the n-type thermoelectric member;
each of the plurality of the internal electrodes comprises an external flange expanded in a direction from the internal periphery of the p-type thermoelectric member toward the external periphery of the p-type thermoelectric member;
each of the external flanges is interposed between the n-type thermoelectric member and the p-type thermoelectric member which are adjacent to each other;
each of the external flanges is formed of an electrically conductive material;
a third insulation film is interposed between the external flange and the p-type thermoelectric member; and
a fourth insulation film is interposed between the external flange and the n-type thermoelectric member.

2. The tubular thermoelectric generation device according to claim 1, further comprising:
a first insulator that includes the first insulation film and the second insulation film;
a second insulator that includes the third insulation film and the fourth insulation film;
the internal flange is inserted from a side of the first insulator into an inside of the first insulator; and
the external flange is inserted from a side of the second insulator into an inside of the second insulator.

3. The tubular thermoelectric generation device according to claim 1, wherein
each of the p-type thermoelectric members and the n-type thermoelectric members has a shape of a ring.

4. The tubular thermoelectric generation device according to claim 1, wherein
each of the plurality of the external electrodes is a hollow electrode having a shape of a column or a prism;
each of the plurality of the external electrodes has an external periphery and an internal periphery; and
each of the internal flanges is expanded from the internal periphery of the external electrode.

5. The tubular thermoelectric generation device according to claim 1, wherein
each of the internal flanges is divided into a plurality of internal flange fragments.

6. The tubular thermoelectric generation device according to claim 1, wherein
each of the plurality of the internal electrodes is a hollow electrode having a shape of a column or a prism;
each of the plurality of the internal electrodes has an external periphery and an internal periphery; and
each of the external flanges is expanded from the external periphery of the internal electrode.

7. The tubular thermoelectric generation device according to claim 1, wherein
each of the external flanges is divided into a plurality of external flange fragments.

8. The tubular thermoelectric generation device according to claim 1, wherein
each of the internal flanges has a thickness which decreases in a direction from the external periphery of the p-type thermoelectric member toward the internal periphery of the p-type thermoelectric member.

9. The tubular thermoelectric generation device according to claim 1, wherein
each of the external flanges has a thickness which decreases in a direction from the internal periphery of the p-type thermoelectric member toward the external periphery of the p-type thermoelectric member.

10. The tubular thermoelectric generation device according to claim 1, wherein
an end of each of the internal flanges is interposed between two of the internal electrodes which are adjacent to each other.

11. The tubular thermoelectric generation device according to claim 1, wherein
an end of each of the external flanges is interposed between two of the external electrodes which are adjacent to each other.

12. A tubular thermoelectric generation device, comprising:
a plurality of plate-like p-type thermoelectric members each having an external periphery, a through hole, and an internal periphery formed around the through hole;
a plurality of plate-like n-type thermoelectric members each having an external periphery, a through hole, and an internal periphery formed around the through hole;
a plurality of external electrodes; and
a plurality of internal electrodes,
wherein
the plurality of plate-like p-type thermoelectric members and the plurality of plate-like n-type thermoelectric members are disposed alternately along an axis direction of the tubular thermoelectric generation device so that each through hole of the plurality of plate-like p-type thermoelectric members and each through hole of the plurality of plate-like n-type thermoelectric members overlap each other;
each of the plurality of the external electrodes is in contact with the external peripheries of the p-type thermoelectric member and the n-type thermoelectric member which are adjacent to each other;
each of the plurality of the internal electrodes is in contact with the internal peripheries of the p-type thermoelectric member and the n-type thermoelectric member which are adjacent to each other;
the plurality of external electrodes and the plurality of internal electrodes are disposed alternately along the axis direction of the tubular thermoelectric generation device;
each of the plurality of the external electrodes comprises an internal flange expanded in a direction from the external periphery of the p-type thermoelectric member toward the internal periphery of the p-type thermoelectric member;
each of the internal flanges is interposed between the p-type thermoelectric member and the n-type thermoelectric member which are adjacent to each other;
each of the internal flanges is formed of an insulator;
each of the internal flanges is in contact with the p-type thermoelectric member and the n-type thermoelectric member which are adjacent to each other;
each of the internal flanges is formed integrally with the external electrode;
each of the plurality of the internal electrodes comprises an external flange expanded in a direction from the internal periphery of the p-type thermoelectric member toward the external periphery of the p-type thermoelectric member;
each of the external flanges is interposed between the n-type thermoelectric member and the p-type thermoelectric member which are adjacent to each other;
each of the external flanges is formed of an insulator;
each of the external flanges is in contact with the n-type thermoelectric member and the p-type thermoelectric member which are adjacent to each other; and
each of the external flanges is formed integrally with the internal electrode.

13. The tubular thermoelectric generation device according to claim 12, wherein
each of the p-type thermoelectric members and the n-type thermoelectric members has a shape of a ring.

14. The tubular thermoelectric generation device according to claim 12, wherein
each of the plurality of the external electrodes is a hollow electrode having a shape of a column or a prism;
each of the plurality of the external electrodes has an external periphery and an internal periphery; and
each of the internal flanges is expanded from the internal periphery of the external electrode.

15. The tubular thermoelectric generation device according to claim 12, wherein
each of the internal flanges is divided into a plurality of internal flange fragments.

16. The tubular thermoelectric generation device according to claim 12, wherein
each of the plurality of the internal electrodes is a hollow electrode having a shape of a column or a prism;
each of the plurality of the internal electrodes has an external periphery and an internal periphery; and
each of the external flanges is expanded from the external periphery of the internal electrode.

17. The tubular thermoelectric generation device according to claim 12, wherein
each of the external flanges is divided into a plurality of external flange fragments.

18. The tubular thermoelectric generation device according to claim 12, wherein
each of the internal flanges has a thickness which decreases in a direction from the external periphery of the p-type thermoelectric member toward the internal periphery of the p-type thermoelectric member.

19. The tubular thermoelectric generation device according to claim 12, wherein
each of the external flanges has a thickness which decreases in a direction from the internal periphery of the p-type thermoelectric member toward the external periphery of the p-type thermoelectric member.

20. The tubular thermoelectric generation device according to claim 12, wherein
an end of each of the internal flanges is interposed between two of the internal electrodes which are adjacent to each other.

21. The tubular thermoelectric generation device according to claim 12, wherein
an end of each of the external flanges is interposed between two of the external electrodes which are adjacent to each other.

22. A method for generating an electric power using a tubular thermoelectric generation device, the method comprising:
(a) preparing the tubular thermoelectric generation device comprising:
a plurality of plate-like p-type thermoelectric members each having an external periphery, a through hole, and an internal periphery formed around the through hole;
a plurality of plate-like n-type thermoelectric members each having an external periphery, a through hole, and an internal periphery formed around the through hole;
a plurality of external electrodes; and
a plurality of internal electrodes,
wherein
the plurality of plate-like p-type thermoelectric members and the plurality of plate-like n-type thermoelectric members are disposed alternately along an axis direction of the tubular thermoelectric generation device so that each through hole of the plurality of plate-like p-type thermoelectric members and each through hole of the plurality of plate-like n-type thermoelectric members overlap each other;
each of the plurality of the external electrodes is in contact with the external peripheries of the p-type thermoelectric member and the n-type thermoelectric member which are adjacent to each other;
each of the plurality of the internal electrodes is in contact with the internal peripheries of the p-type thermoelectric member and the n-type thermoelectric member which are adjacent to each other;
the plurality of external electrodes and the plurality of internal electrodes are disposed alternately along the axis direction of the tubular thermoelectric generation device;
each of the plurality of the external electrodes comprises an internal flange expanded in a direction from the external periphery of the p-type thermoelectric member toward the internal periphery of the p-type thermoelectric member;
each of the internal flanges is interposed between the p-type thermoelectric member and the n-type thermoelectric member which are adjacent to each other;
each of the internal flanges is formed of an electrically conductive material;
a first insulation film is interposed between the internal flange and the p-type thermoelectric member;
a second insulation film is interposed between the internal flange and the n-type thermoelectric member;
each of the plurality of the internal electrodes comprises an external flange expanded in a direction from the internal periphery of the p-type thermoelectric member toward the external periphery of the p-type thermoelectric member;
each of the external flanges is interposed between the n-type thermoelectric member and the p-type thermoelectric member which are adjacent to each other;
each of the external flanges is formed of an electrically conductive material;
a third insulation film is interposed between the external flange and the p-type thermoelectric member; and
a fourth insulation film is interposed between the external flange and the n-type thermoelectric member; and
(b) flowing a fluid through an inside of the tubular thermoelectric generation device to generate an electric potential difference between both ends of the tubular thermoelectric generation device by temperature difference generated between the inside and an outside of the tubular thermoelectric generation device.

23. A method for generating an electric power using a tubular thermoelectric generation device, the method comprising:
(a) preparing the tubular thermoelectric generation device comprising:
a plurality of plate-like p-type thermoelectric members each having an external periphery, a through hole, and an internal periphery formed around the through hole;
a plurality of plate-like n-type thermoelectric members each having an external periphery, a through hole, and an internal periphery formed around the through hole;
a plurality of external electrodes; and
a plurality of internal electrodes,
wherein
the plurality of plate-like p-type thermoelectric members and the plurality of plate-like n-type thermoelectric members are disposed alternately along an axis direction of the tubular thermoelectric generation device so that each through hole of the plurality of plate-like p-type thermoelectric members and each through hole of the plurality of plate-like n-type thermoelectric members overlap each other;
each of the plurality of the external electrodes is in contact with the external peripheries of the p-type thermoelectric member and the n-type thermoelectric member which are adjacent to each other;
each of the plurality of the internal electrodes is in contact with the internal peripheries of the p-type thermoelectric member and the n-type thermoelectric member which are adjacent to each other;
the plurality of external electrodes and the plurality of internal electrodes are disposed alternately along the axis direction of the tubular thermoelectric generation device;
each of the plurality of the external electrodes comprises an internal flange expanded in a direction from the external periphery of the p-type thermoelectric member toward the internal periphery of the p-type thermoelectric member;
each of the internal flanges is interposed between the p-type thermoelectric member and the n-type thermoelectric member which are adjacent to each other;
each of the internal flanges is formed of an insulator;
each of the internal flanges is in contact with the p-type thermoelectric member and the n-type thermoelectric member which are adjacent to each other;
each of the internal flanges is formed integrally with the external electrode;

each of the plurality of the internal electrodes comprises an external flange expanded in a direction from the internal periphery of the p-type thermoelectric member toward the external periphery of the p-type thermoelectric member;

each of the external flanges is interposed between the n-type thermoelectric member and the p-type thermoelectric member which are adjacent to each other;

each of the external flanges is formed of an insulator;

each of the external flanges is in contact with the n-type thermoelectric member and the p-type thermoelectric member which are adjacent to each other; and each of the external flanges is formed integrally with the internal electrode; and (b) flowing a fluid through an inside of the tubular thermoelectric generation device to generate an electric potential difference between both ends of the tubular thermoelectric generation device by the action of temperature difference generated between the inside and an outside of the tubular thermoelectric generation device.

24. A method for fabricating a tubular thermoelectric generation device, the method comprising:

(a) preparing a stacked structure comprising:

a plurality of plate-like p-type thermoelectric members each having an external periphery, a through hole, and an internal periphery formed around the through hole;

a plurality of plate-like n-type thermoelectric members each having an external periphery, a through hole, and an internal periphery formed around the through hole;

a plurality of external electrodes; and a plurality of internal electrodes, wherein the plurality of plate-like p-type thermoelectric members and the plurality of plate-like n-type thermoelectric members are disposed alternately so that each through hole of the plurality of plate-like p-type thermoelectric members and each through hole of the plurality of plate-like n-type thermoelectric members overlap each other when viewed along the normal direction of the plate-like p-type thermoelectric members and the plate-like n-type thermoelectric members;

each of the plurality of the external electrodes is in contact with the external peripheries of the p-type thermoelectric member and the n-type thermoelectric member which are adjacent to each other;

each of the plurality of the internal electrodes is in contact with the internal peripheries of the p-type thermoelectric member and the n-type thermoelectric member which are adjacent to each other;

the plurality of external electrodes and the plurality of internal electrodes are disposed alternately along the axis direction of the tubular thermoelectric generation device;

each of the plurality of the external electrodes comprises an internal flange expanded in a direction from the external periphery of the p-type thermoelectric member toward the internal periphery of the p-type thermoelectric member;

each of the internal flanges is interposed between the p-type thermoelectric member and the n-type thermoelectric member which are adjacent to each other;

each of the internal flanges is formed of an electrically conductive material;

a first insulation film is interposed between the internal flange and the p-type thermoelectric member;

a second insulation film is interposed between the internal flange and the n-type thermoelectric member;

each of the internal flanges is interposed between the p-type thermoelectric member and the n-type thermoelectric member which are adjacent to each other;

each of the plurality of the internal electrodes comprises an external flange expanded in a direction from the internal periphery of the p-type thermoelectric member toward the external periphery of the p-type thermoelectric member;

each of the external flanges is interposed between the n-type thermoelectric member and the p-type thermoelectric member which are adjacent to each other;

each of the external flanges is formed of an electrically conductive material;

a third insulation film is interposed between the external flange and the p-type thermoelectric member; and a fourth insulation film is interposed between the external flange and the n-type thermoelectric member; and (b) compressing and heating the stacked structure to obtain the tubular thermoelectric generation device.

25. A method for fabricating a tubular thermoelectric generation device, the method comprising:

(a) preparing a stacked structure comprising:

a plurality of plate-like p-type thermoelectric members each having an external periphery, a through hole, and an internal periphery formed around the through hole;

a plurality of plate-like n-type thermoelectric members each having an external periphery, a through hole, and an internal periphery formed around the through hole;

a plurality of external electrodes; and a plurality of internal electrodes, wherein the plurality of plate-like p-type thermoelectric members and the plurality of plate-like n-type thermoelectric members are disposed alternately so that each through hole of the plurality of plate-like p-type thermoelectric members and each through hole of the plurality of plate-like n-type thermoelectric members overlap each other when viewed along the normal direction of the plate-like p-type thermoelectric members and the plate-like n-type thermoelectric members;

each of the plurality of the external electrodes is in contact with the external peripheries of the p-type thermoelectric member and the n-type thermoelectric member which are adjacent to each other;

each of the plurality of the internal electrodes is in contact with the internal peripheries of the p-type thermoelectric member and the n-type thermoelectric member which are adjacent to each other;

the plurality of external electrodes and the plurality of internal electrodes are disposed alternately along the axis direction of the tubular thermoelectric generation device;

each of the plurality of the external electrodes comprises an internal flange expanded in a direction from the external periphery of the p-type thermoelectric member toward the internal periphery of the p-type thermoelectric member;

each of the internal flanges is interposed between the p-type thermoelectric member and the n-type thermoelectric member which are adjacent to each other;

each of the internal flanges is formed of an insulator;

each of the internal flanges is in contact with the p-type thermoelectric member and the n-type thermoelectric member which are adjacent to each other;

each of the internal flanges is formed integrally with the external electrode;

each of the internal flanges is interposed between the p-type thermoelectric member and the n-type thermoelectric member which are adjacent to each other;

each of the plurality of the internal electrodes comprises an external flange expanded in a direction from the internal periphery of the p-type thermoelectric member toward the external periphery of the p-type thermoelectric member;

each of the external flanges is interposed between the n-type thermoelectric member and the p-type thermoelectric member which are adjacent to each other;

each of the external flanges is formed of an insulator;

each of the external flanges is in contact with the n-type thermoelectric member and the p-type thermoelectric member which are adjacent to each other; and each of the external flanges is formed integrally with the internal electrode; and (b) compressing and heating the stacked structure to obtain the tubular thermoelectric generation device.

\* \* \* \* \*